US012730149B2

(12) United States Patent
Kim

(10) Patent No.: US 12,730,149 B2
(45) Date of Patent: Sep. 8, 2026

(54) DISPLAY DEVICE, PANEL DEFECT DETECTION CIRCUIT AND PANEL DEFECT DETECTION METHOD

(71) Applicant: LG Display Co., Ltd., Seoul (KR)

(72) Inventor: Sangyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 327 days.

(21) Appl. No.: 18/529,919

(22) Filed: Dec. 5, 2023

(65) Prior Publication Data

US 2024/0219463 A1 Jul. 4, 2024

(30) Foreign Application Priority Data

Dec. 29, 2022 (KR) ........................ 10-2022-0188625

(51) Int. Cl.
*G01R 31/317* (2006.01)

(52) U.S. Cl.
CPC .............................. *G01R 31/31727* (2013.01)

(58) Field of Classification Search
CPC ........................... G01R 31/26; G01R 31/2642; G01R 31/2648; G01R 31/2831; G01R 31/31702

See application file for complete search history.

(56) References Cited

U.S. PATENT DOCUMENTS

| | | | | |
|---|---|---|---|---|
| 9,972,233 | B2 | 5/2018 | Lim | |
| 10,535,285 | B2 * | 1/2020 | Zeng | G09G 3/3677 |
| 2014/0329339 | A1 * | 11/2014 | Chaji | G09G 3/006 438/10 |
| 2018/0151142 | A1 * | 5/2018 | Tian | G02F 1/136204 |

FOREIGN PATENT DOCUMENTS

| | | | |
|---|---|---|---|
| KR | 2008-0083960 | A | 9/2008 |
| KR | 10-2317137 | B1 | 10/2021 |

* cited by examiner

*Primary Examiner* — Tung X Nguyen
(74) *Attorney, Agent, or Firm* — Seed Intellectual Property Law Group LLP

(57) ABSTRACT

Embodiments of the present disclosure relate to a display device, panel defect detection circuit and panel defect detection method. In particular, panel defect detection circuit may detect a panel defect of a display panel by using a signal input to a gate driving circuit or a signal output from the gate driving circuit as a test signal, and a reference signal, thereby detecting the panel defects using signals related to gate driving without using a separate panel defect detection algorithm.

19 Claims, 21 Drawing Sheets

700
910
911
912
913
920
921
922
140
LS1
LS2
LS3
I1
I2
I3
O1T
O2T
O3T
O1R
O2R
O3R
IN_SIG1
IN_SIG2
IN_SIG3
CLK1
CLK2
CLK3
SEL1
SEL2
SEL3
SEL1R
SEL2R
SEL3R
REF_SIG
P1
P2
P3
TP
RP
CL
CL1
CL2
CL3
TEST_SIG
SEL_CTR
VGH
VGL
IN1
IN2
OUT
OUT_SIG
RESULT

700
GL1
GL2
GL3
GL
Vgate1
Vgate2
Vgate3
P1
P2
P3
912
SEL1
SEL2
SEL3
TP
SEL_CTR
RP
913
912
910
913
TEST_SIG
REF_SIG
920
921
IN2
IN1
VGH
VGL
OUT
OUT_SIG
922
RESULT
140

DISPLAY DEVICE, PANEL DEFECT DETECTION CIRCUIT AND PANEL DEFECT DETECTION METHOD

CROSS REFERENCE TO RELATED APPLICATION

This application claims priority from Korean Patent Application No. 10-2022-0188625, filed on Dec. 29, 2022, which is hereby incorporated by reference for all purposes as if fully set forth herein.

BACKGROUND

Technical Field

The present disclosure relates to a display device, a panel defect detection circuit and a panel defect detection method.

Description of the Related Art

With the development of display technology, there are developed various types of display devices such as liquid crystal displays, organic light emitting displays, inorganic light emitting displays, and quantum dot displays.

A display device, regardless of a type of display device, may basically include a display panel and a driving circuit for driving the display panel. A display panel is the most essential part of a display device and has an absolute influence on the performance of the display device. Therefore, if a defect occurs in the display panel, the image quality of the display device may be greatly deteriorated or, in severe cases, the intrinsic function of the display device may be disabled.

Although the display panel is an important component, there may be occurred defects due to various unexplained causes during the manufacturing process. In addition, the display panel may be defective for various reasons even after shipment and during use by a user. For example, the defect of the display panel may be a crack generated in the display panel.

Detecting panel defects is not only a very difficult task, but also requires a separate detection algorithm or expensive detection equipment.

BRIEF SUMMARY

Embodiments of the present disclosure may provide a display device, a panel defect detection circuit and a panel defect detection method capable of accurately and simply detecting panel defects using signals related to gate driving without using a separate panel defect detection algorithm.

Embodiments of the present disclosure may provide a display device, a panel defect detection circuit and a panel defect detection method capable of accurately and simply detecting panel defects even with a simple sub-pixel structure without having a complex sub-pixel structure for detecting panel defects.

Embodiments of the present disclosure may provide a display device, panel defect detection circuit and panel defect detection method capable of detecting panel defects in a sub-pixel independent manner.

In one aspect, embodiments of the present disclosure may provide a display device including a display panel including a plurality of gate lines, a gate driving circuit configured to drive the plurality of gate lines, and a panel defect detection circuit configured to detect panel defects of the display panel by outputting a test result signal using a signal input to the gate driving circuit or a signal output from the gate driving circuit as a test signal, and a reference signal.

The test result signal may have a low level voltage if a voltage level of the test signal and a voltage level of the reference signal are equal, and the test result signal may have a high level voltage if the voltage level of the test signal and the voltage level of the reference signal are different from each other.

The test result signal may be one of a first type having two high level voltage periods, a second type having no high level voltage period, and a third type having one high level voltage period.

The display device according to embodiments of the present disclosure may further include a controller configured to control an operation of the gate driving circuit and configured to determine whether of a panel defect exists in the display panel based on the test result signal.

The panel defect detection circuit may include a test circuit configured to receive the test signal and the reference signal and output the test result signal, and a signal supply circuit configured to supply the test signal and the reference signal to the test circuit.

The test circuit may include a logic circuit configured to output an output signal according to the test signal and the reference signal, and a level conversion circuit configured to convert a voltage level of the output signal to a selected value or less and output an output signal having the converted voltage level as the test result signal. In this case, the selected value corresponds to a maximum voltage level that the controller is able to handle. Differently put, the selected value is indicative of a maximum voltage level that the controller can process for determining whether the display panel includes a panel defect.

The logic circuit may be configured to output the output signal having a low level voltage if the voltage level of the test signal and the voltage level of the reference signal are equal, and output the output signal having a high level voltage if the voltage level of the test signal and the voltage level of the reference signal are different from each other.

The controller may be configured to determine whether the panel defect exists in the display panel based on at least one of a number and a length of high level voltage periods included in the test result signal.

The controller may be configured to determine that a panel defect has occurred in the display panel in the case that the test result signal does not include a high level voltage period or the test result signal includes one high level voltage period.

The controller may be configured to determine, if the test result signal includes two high level voltage period, whether the panel defect exists in the display panel based on a length of each of the two high level voltage periods.

The controller may be configured to determine that no panel defect has occurred in the display panel if the test result signal includes a first high level voltage period having a length within a first threshold range and a second high level voltage period having a length within a second threshold range.

The test signal may be a clock signal input to the gate driving circuit or a gate signal generated by the gate driving circuit based on the clock signal and output to one gate line among a plurality of gate lines.

The panel defect detection circuit according to embodiments of the present disclosure may include a test circuit configured to receive the test signal and the reference signal and output the test result signal, and a signal supply circuit configured to supply the test signal and the reference signal to the test circuit.

The test signal may be a signal input to a gate driving circuit for driving a plurality of gate lines disposed on the display panel, or a signal output from the gate driving circuit to one of a plurality of gate lines.

The test signal may be a clock signal input to the gate driving circuit, or a gate signal generated by the gate driving circuit based on the clock signal and output to one of a plurality of gate lines.

The test result signal may have a low level voltage if a voltage level of the test signal and a voltage level of a reference signal are equal, and the test result signal may have a high level voltage if the voltage level of the test signal and the voltage level of the reference signal are different from each other.

The test result signal may be one of a first type having two high level voltage periods, a second type having no high level voltage period, and a third type having one high level voltage period.

The test circuit may include a logic circuit configured to output an output signal according to the test signal and the reference signal, and a level conversion circuit configured to convert a voltage level of the output signal to a selected value or less and output an output signal having the converted voltage level as the test result signal.

The test circuit may include an exclusive OR element which receives the test signal and the reference signal and outputs an output signal.

A panel defect detection method according to embodiments of the present disclosure may include receiving a test signal and a reference signal, generating a test result signal based on the test signal and the reference signal, and determining whether a panel defect occurs in a display panel based on the test result signal.

The test signal may correspond to one of a signal input to a gate driving circuit for driving a plurality of gate lines disposed on a display panel, and a signal output from the gate driving circuit to one of the plurality of gate lines.

The test result signal may have a low level voltage if a voltage level of the test signal and a voltage level of a reference signal are equal, and the test result signal may have a high level voltage if the voltage level of the test signal and the voltage level of the reference signal are different from each other.

The test result signal may be one of a first type having two high level voltage periods, a second type having no high level voltage period, and a third type having one high level voltage period.

According to embodiments of the present disclosure, it is possible to provide a display device, a panel defect detection circuit and a panel defect detection method capable of accurately and simply detecting panel defects using signals related to gate driving without using a separate panel defect detection algorithm.

According to embodiments of the present disclosure, it is possible to provide a display device, a panel defect detection circuit and a panel defect detection method capable of accurately and simply detecting panel defects even with a simple sub-pixel structure without having a complex sub-pixel structure for detecting panel defects by using a signal related to gate driving.

According to embodiments of the present disclosure, it is possible to simply detect the panel defects using a signal related to gate driving without using a separate complicated panel defect detection algorithm, thereby reducing power consumption required for panel defect detection (low power).

According to embodiments of the present disclosure, it is possible to detect panel defects in a method independent of sub-pixels without using a separate panel defect detection algorithm which requires changing the sub-pixel structure, so that the sub-pixel structure disposed in the display panel can be simplified, thereby simplifying the manufacturing process and reducing production energy (process optimization).

DETAILED DESCRIPTION

Figure 1:
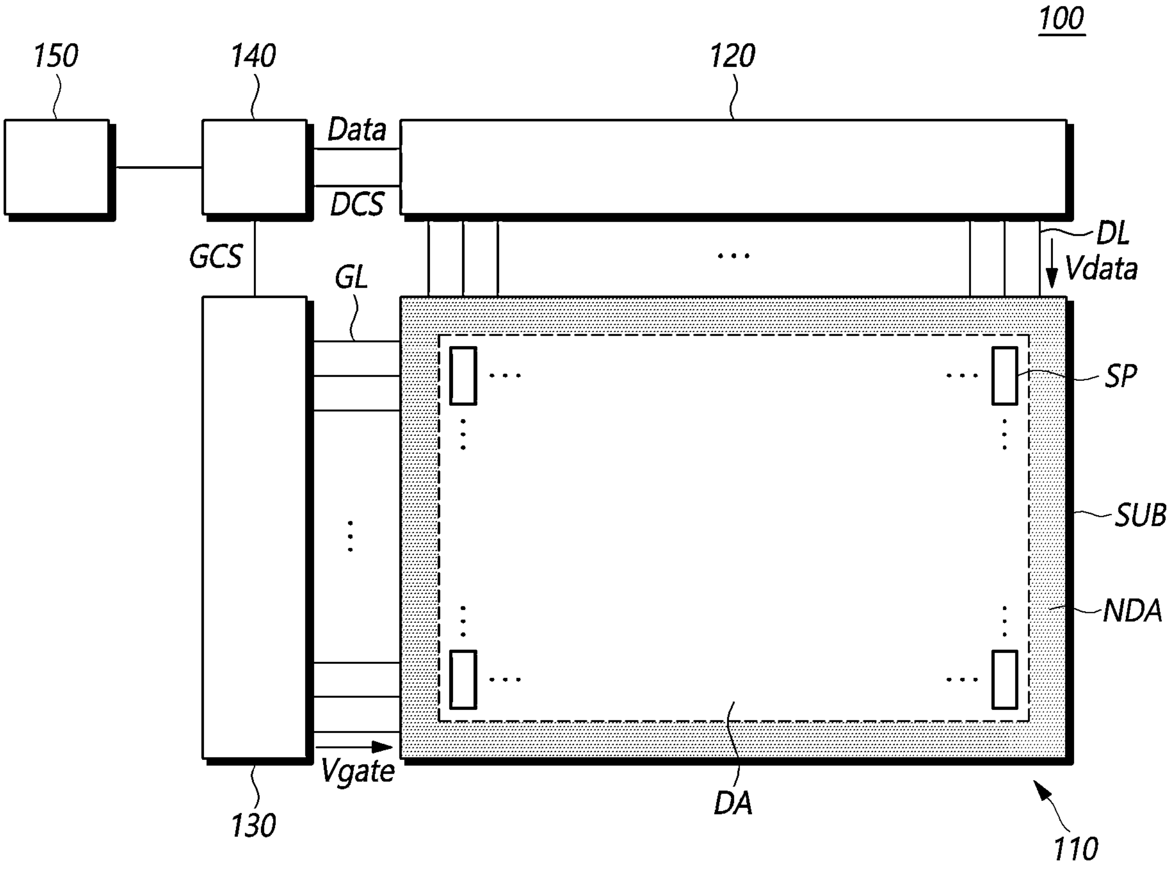
FIG. 1 illustrates a system configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the present disclosure will be described in detail with reference to accompanying drawings.

FIG. 1 illustrates a system configuration of a display device 100 according to embodiments of the present disclosure.

Referring to FIG. 1, a display device 100 according to embodiments of the present disclosure may include a display panel 110 and a driving circuit for driving the display panel 110.

The driving circuit may include a data driving circuit 120, a gate driving circuit 130, and the like, and may further include a controller 140 that controls the data driving circuit 120 and the gate driving circuit 130.

The display panel 110 may include a substrate SUB and signal lines (also referred to as wiring) such as a plurality of data lines DL and a plurality of gate lines GL disposed on the substrate SUB. The display panel 110 may include a plurality of sub-pixels SP connected to the plurality of data lines DL and the plurality of gate lines GL.

The display panel 110 may include a display area DA in which an image is displayed and a non-display area NDA in which an image is not displayed, and which is located around the display area DA. In the display panel 110, the plurality of sub-pixels SP for displaying an image may be disposed in the display area DA, and in the non-display area NDA, the data driving circuit 120, the gate driving circuit 130, and the controller 140 may be electrically connected or the data driving circuit 120, the gate driving circuit 130, and the controller 140 may be mounted, and a pad part to which an integrated circuit, a printed circuit, or the like is connected may be disposed.

The data driving circuit 120 is a circuit for driving a plurality of data lines DL, and may supply data voltages Vdata to the plurality of data lines DL. Here, the data voltage Vdata may be also referred to as a data signal, a source signal, or a video signal.

The gate driving circuit 130 is a circuit for driving the plurality of gate lines GL, and may supply gate signals Vgate to the plurality of gate lines GL. Here, the gate signal Vgate may be also referred to as a gate voltage or a scanning gate signal.

The controller 140 may supply a data control signal DCS to the data driving circuit 120 in order to control an operation timing of the data driving circuit 120. The controller 140 may supply a gate control signal GCS for controlling an operation timing of the gate driving circuit 130 to the gate driving circuit 130.

The controller 140 may control such that a scanning operation starts according to a timing implemented in each frame, convert input image data, which is input from the outside, according to a data signal format used by the data driving circuit 120 and supply image data Data, which is the converted data, to the data driving circuit 120, and control such that data driving is performed at an appropriate time according to a scanning timing.

The controller 140 may receive various timing signals including a vertical synchronization signal VSYNC, a horizontal synchronization signal HSYNC, an input data enable signal (DE: Data Enable), and a clock signal CLK from an external (e.g., host system 150), together with the input image data.

The controller 140, in order to control the data driving circuit 120 and the gate driving circuit 130, may receive the timing signal such as a vertical synchronization signal VSYNC, a horizontal synchronization signal HSYNC, an input data enable signal DE, and a clock signal CLK, and generate various control signals DCS and GCS and output to the data driving circuit 120 and the gate driving circuit 130.

For example, in order to control the gate driving circuit 130, the controller 140 may output various types of gate control signals GCS including a gate start pulse GSP, a gate shift clock GSC, a gate output enable signal GOE, and the like.

In addition, in order to control the data driving circuit 120, the controller 140 may output various types of data control signals DCS including a source start pulse SSP, a source sampling clock SSC, a source output enable signal SOE, and the like.

The controller 140 may be implemented as a separate component from the data driving circuit 120 or implemented as an integrated circuit by being integrated with the data driving circuit 120.

The data driving circuit 120 may converts the image data Data input from the controller 140 into a data voltage Vdata corresponding to an analog voltage in order to drive a plurality of data lines DL and supply the data voltage Vdata to a plurality of data lines DL. Here, the data driving circuit 120 is also referred to as a source driving circuit.

The data driving circuit 120 may include one or more source driver integrated circuits SDIC.

Each source driver integrated circuit SDIC may include a shift register, a latch circuit, a digital to analog converter (DAC), an output buffer, and the like. In some cases, each source driver integrated circuit SDIC may further include an analog to digital converter (ADC).

For example, each source driver integrated circuit SDIC may be connected to the display panel 110 by a tape-automated bonding (TAB) method, may be connected to a bonding pad of the display panel 110 by a chip-on-glass (COG) method or a chip-on-panel (COP) method, or may be connected to the display panel 110 by a chip-on-film (COF) method.

The gate driving circuit 130 may output a gate signal Vgate under the control of the controller 140. The gate driving circuit 130 may supply the gate signal Vgate to the plurality of gate lines GL in order to drive the plurality of gate lines GL. Here, the gate signal Vgate may include a signal period having a turn-on level voltage and a signal period having a turn-off level voltage.

The gate driving circuit 130 may be connected to the display panel 110 by a TAB method, may be connected to the bonding pad of the display panel 110 by a COG method or a COP method, or may be connected to the display panel 110 by a COF method. Alternatively, the gate driving circuit 130 may be formed in the non-display area NDA of the display panel 110 in a gate-in-panel (GIP) type. The gate driving circuit 130 may be disposed on the substrate SUB or may be connected to the substrate SUB. That is, in a case in which the gate driving circuit 130 is a GIP type, the gate driving circuit 130 may be disposed in the non-display area NDA of the substrate SUB. In a case in which the gate driving circuit 130 is a COG type, a COF type, or the like, the gate driving circuit 130 may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the sub-pixels SP, or may also be disposed to partially or entirely overlap the sub-pixels SP.

If a specific gate line GL selected by the driving timing is driven by the gate driving circuit 130, the data driving circuit 120 may convert the image data Data, which is received from the controller 140, into an analog-type data voltage Vdata and supply the converted analog-type data voltage to the plurality of data lines DL.

The data driving circuit 120 may be connected to one side (e.g., an upper side or a lower side) of the display panel 110. Depending on a driving method, a panel design method, or the like, the data driving circuit 120 may be connected to both sides (e.g., the upper side and the lower side) of the display panel 110 or may also be connected to two or more sides of four sides of the display panel 110.

The gate driving circuit 130 may be connected to one side (e.g., a left side or a right side) of the display panel 110. Depending on a driving method, a panel design method, or the like, the gate driving circuit 130 may be connected to both sides (e.g., the left side and the right side) of the display panel 110 or may also be connected to two or more sides of the four sides of the display panel 110.

The controller 140 may be a timing controller used in a conventional display technique or a control device that may further perform other control functions in addition to the function of the timing controller, may be a control device different from the timing controller, or may be a circuit in the control device.

The controller 140 may be implemented as various circuits or electronic components, such as integrated circuits (ICs), field-programmable gate arrays (FPGAs), application-specific integrated circuits (ASICs), processors, or the like.

The controller 140 may be mounted on a printed circuit board, a flexible printed circuit board, or the like, and may be electrically connected to the data driving circuit 120 and the gate driving circuit 130 through the printed circuit board, the flexible printed circuit board, or the like.

The controller 140 may transmit and receive signals to and from the data driving circuit 120 according to one or more selected interfaces. Here, for example, the interface may include a low voltage differential signaling (LVDS) interface, an embedded clock point-point interface (EPI), a serial peripheral interface (SPI), and the like.

The controller 140 may include a storage medium such as one or more registers.

The display device 100 according to embodiments of the present disclosure may be a display device with a non-emitting display panel 110, such as a liquid crystal display device. Such a display device may include a backlight unit.

Alternatively, the display device 100 according to embodiments of the present disclosure may be a self-luminous display device in which the display panel 110 emits light itself. The self-luminous display device may include various types of display devices according to types of light emitting devices. For example, the display device 100 according to embodiments of the present disclosure may include an organic light emitting display device using an organic light emitting diode OLED as a light emitting device, an inorganic light emitting display device using an inorganic light emitting diode as a light emitting device, or a quantum dot display device using quantum dots as a light emitting device. Here, the inorganic light emitting diode may be referred to as a light emitting diode (LED), a micro light emitting diode, or the like.

Figure 2:
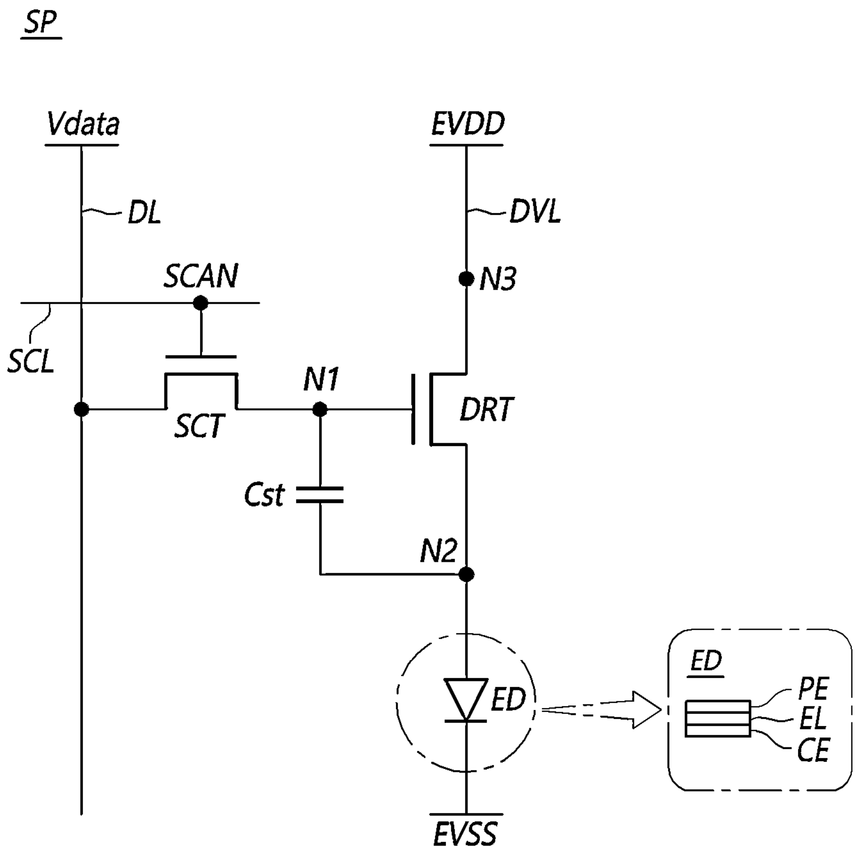
FIG. 2 is an equivalent circuit diagram of a sub-pixel of a display device according to embodiments of the present disclosure.

FIG. 2 is an equivalent circuit diagram of the sub-pixel SP of the display device 100 according to embodiments of the present disclosure.

Referring to FIG. 2, each of the plurality of sub-pixels SP disposed in the display panel 110 of the display device 100 according to embodiments of the present disclosure may include a light emitting device ED, a driving transistor DRT, a scanning transistor SCT, and a storage capacitor Cst.

The light emitting device ED may include a pixel electrode PE, a common electrode CE, and a light emitting layer EL located between the pixel electrode PE and the common electrode CE.

The pixel electrode PE of the light emitting device ED may be an electrode disposed in each sub-pixel SP, and may correspond to or be electrically connected to a second node N2 of the driving transistor DRT. The common electrode CE of the light emitting device ED may be an electrode commonly disposed in all sub-pixels SP. A base voltage EVSS may be applied to the common electrode CE of the light emitting device ED.

The pixel electrode PE may be an anode and the common electrode CE may be a cathode. In contrast, the pixel electrode PE may be a cathode and the common electrode CE may be an anode.

For example, the light emitting device ED may be an organic light emitting diode (OLED), an inorganic light emitting diode, a quantum dot light emitting device, or the like. Here, the inorganic light emitting diode is also referred to as a light emitting diode (LED), a micro light emitting diode, a light emitting diode chip, or a micro light emitting diode chip.

The driving transistor DRT is a transistor for driving the light-emitting device ED, and may include a first node N1, a second node N2, a third node N3, and the like.

The first node N1 of the driving transistor DRT may be a gate node of the driving transistor DRT and may be electrically connected to a source node or a drain node of the scanning transistor SCT.

The second node N2 of the driving transistor DRT may be a source node or a drain node of the driving transistor DRT, may be electrically connected to a source node or a drain node of the sensing transistor SENT (see FIG. 3), and also be electrically connected to the pixel electrode PE of the light emitting device ED.

The third node N3 of the driving transistor DRT may be electrically connected to a driving voltage line DVL supplying a driving voltage EVDD.

The scanning transistor SCT may be controlled by a scanning gate signal SCAN, which is a type of gate signal, and may be connected between the first node N1 of the driving transistor DRT and the data line DL.

The scanning transistor SCT may be turned on or off according to a scanning gate signal SCAN supplied from a scanning gate line SCL, which is a type of gate line GL, so as to control a connection between the data line DL and the first node N1 of the driving transistor DRT.

The scanning transistor SCT may be turned on by the scanning gate signal SCAN having a turn-on level voltage, and may transmit the data voltage Vdata supplied from the data line DL to the first node N1 of the driving transistor DRT.

Here, in the case that the scanning transistor SCT is an n-type transistor, the turn-on level voltage of the scanning gate signal SCAN may be a high level voltage. In the case that the scanning transistor SCT is a p-type transistor, the turn-on level voltage of the scanning gate signal SCAN may be a low level voltage.

The storage capacitor Cst may be connected between the second node N2 and the first node N1 of the driving transistor DRT. The storage capacitor Cst is charged with an amount of electric charge corresponding to a voltage difference between both ends thereof and serves to maintain the voltage difference between both ends thereof during a selected frame time. Accordingly, the corresponding sub-pixel SP may emit light during the selected frame time.

Figure 3:
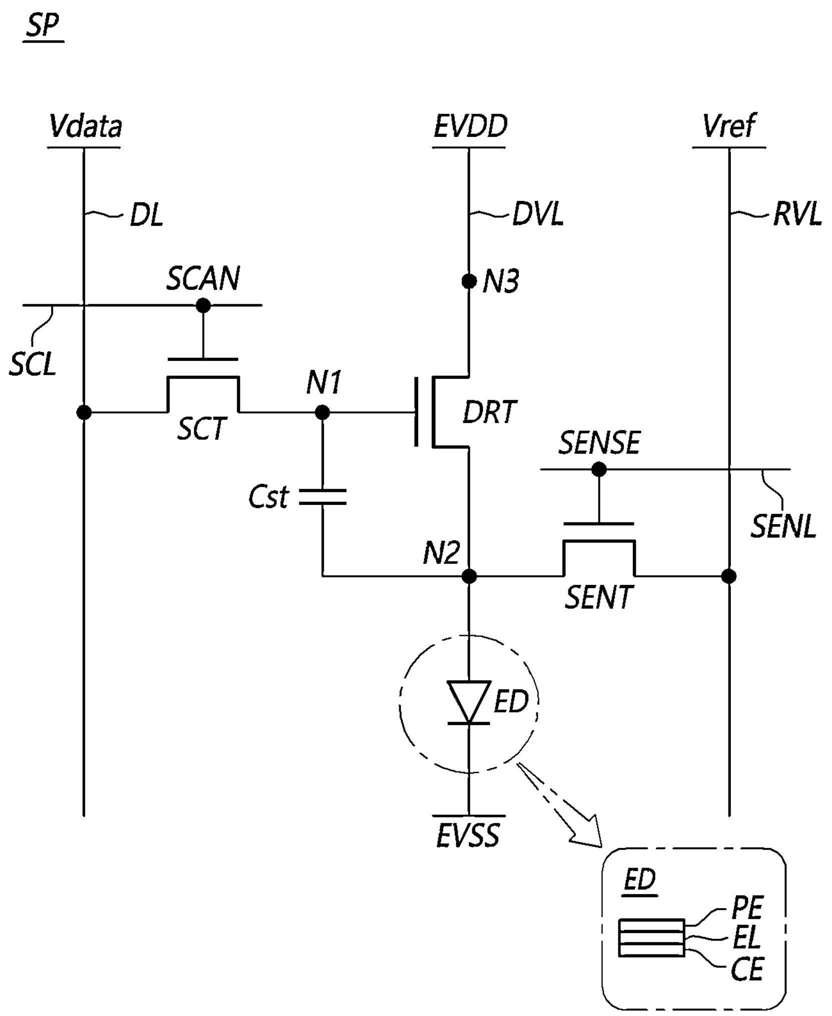
FIG. 3 is another equivalent circuit diagram of a sub-pixel of a display device according to embodiments of the present disclosure.

FIG. 3 is another equivalent circuit diagram of the sub-pixel SP of the display device 100 according to embodiments of the present disclosure.

The sub-pixel SP of FIG. 3 may include a light emitting device ED, a driving transistor DRT, a scanning transistor SCT, and a storage capacitor Cst as in the sub-pixel SP of FIG. 2.

Unlike the sub-pixel SP of FIG. 2, the sub-pixel SP of FIG. 3 may further include a sensing transistor SENT. The sensing transistor SENT may be controlled by a sensing gate signal SENSE, which is a type of gate signal, and may be connected between the second node N2 of the driving transistor DRT and a reference voltage line RVL.

The sensing transistor SENT may be turned on or off according to the sensing gate signal SENSE supplied through a sensing gate line SENL, which is another type of the gate line GL, and may control a connection between the reference voltage line RVL and the second node N2 of the driving transistor DRT.

The sensing transistor SENT may be turned on by the sensing gate signal SENSE having the turn-on level voltage, and may transmit a reference voltage Vref, which is supplied through the reference voltage line RVL, to the second node N2 of the driving transistor DRT.

Further, the sensing transistor SENT may be turned on by the sensing gate signal SENSE having the turn-on level voltage, and may transmit a voltage at the second node N2 of the driving transistor DRT to the reference voltage line RVL.

Here, if the sensing transistor SENT is an n-type transistor, the turn-on level voltage of the sensing gate signal SENSE may be a high level voltage. If the sensing transistor SENT is a p-type transistor, the turn-on level voltage of the sensing gate signal SENSE may be a low level voltage.

The function of the sensing transistor SENT that transmits the voltage at the second node N2 of the driving transistor DRT to the reference voltage line RVL may be used when driven to sense a characteristic value of the sub-pixel SP. In this case, the voltage transmitted to the reference voltage line RVL may be a voltage for calculating the characteristic value of the sub-pixel SP or a voltage reflecting the characteristic value of the sub-pixel SP.

In the present disclosure, the characteristic value of the sub-pixel SP may be a characteristic value of the driving transistor DRT or the light emitting device ED. The characteristic values of the driving transistor DRT may include a threshold voltage and mobility of the driving transistor DRT. The characteristic value of the light emitting device ED may include a threshold voltage of the light emitting device ED.

Each of the driving transistor DRT, the scanning transistor SCT, and the sensing transistor SENT may be an n-type transistor or a p-type transistor. In the present disclosure, for convenience of description, it is assumed that each of the driving transistor DRT, the scanning transistor SCT, and the sensing transistor SENT is the n-type transistor.

The storage capacitor Cst may be an external capacitor intentionally designed to be located outside the driving transistor DRT, rather than a parasitic capacitor (e.g., Cgs or Cgd), which is an internal capacitor that is present between the gate node and the source node (or drain node) of the driving transistor DRT.

The scanning gate line SCL and the sensing gate line SENL may be different gate lines GL. In this case, the scanning gate signal SCAN and the sensing gate signal SENSE may be separate gate signals, and an on-off timing of the scanning transistor SCT and an on-off timing of the sensing transistor SENT in one sub-pixel SP may be independent. That is, the on-off timing of the scanning transistor SCT and the on-off timing of the sensing transistor SENT in one sub-pixel SP may be the same as or different from each other.

Alternatively, the scanning gate line SCL and the sensing gate line SENL may be the same gate line GL. That is, a gate node of the scanning transistor SCT and a gate node of the sensing transistor SENT in one sub-pixel SP may be connected to one gate line GL. In this case, the scanning gate signal SCAN and the sensing gate signal SENSE may be the same gate signal, and the on-off timing of the scanning transistor SCT and the on-off timing of the sensing transistor SENT in one sub-pixel SP may be the same.

The structures of the sub-pixel SP shown in FIGS. 2 and 3 are merely examples and may be variously modified to further include one or more transistors or further include one or more capacitors.

Figure 4:
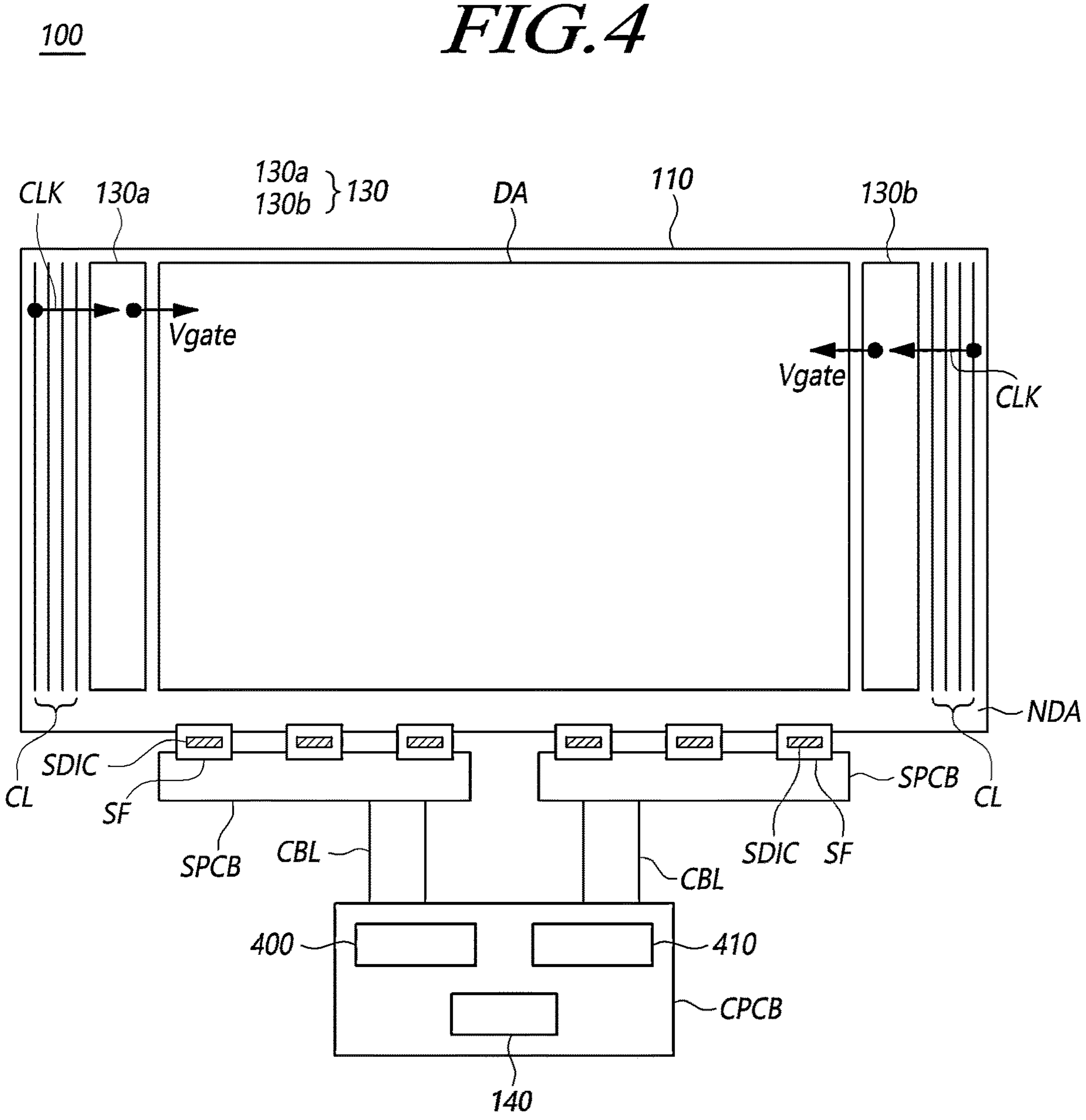
FIG. 4 illustrates an example of a system configuration of a display device according to embodiments of the present disclosure.
Figure 5:
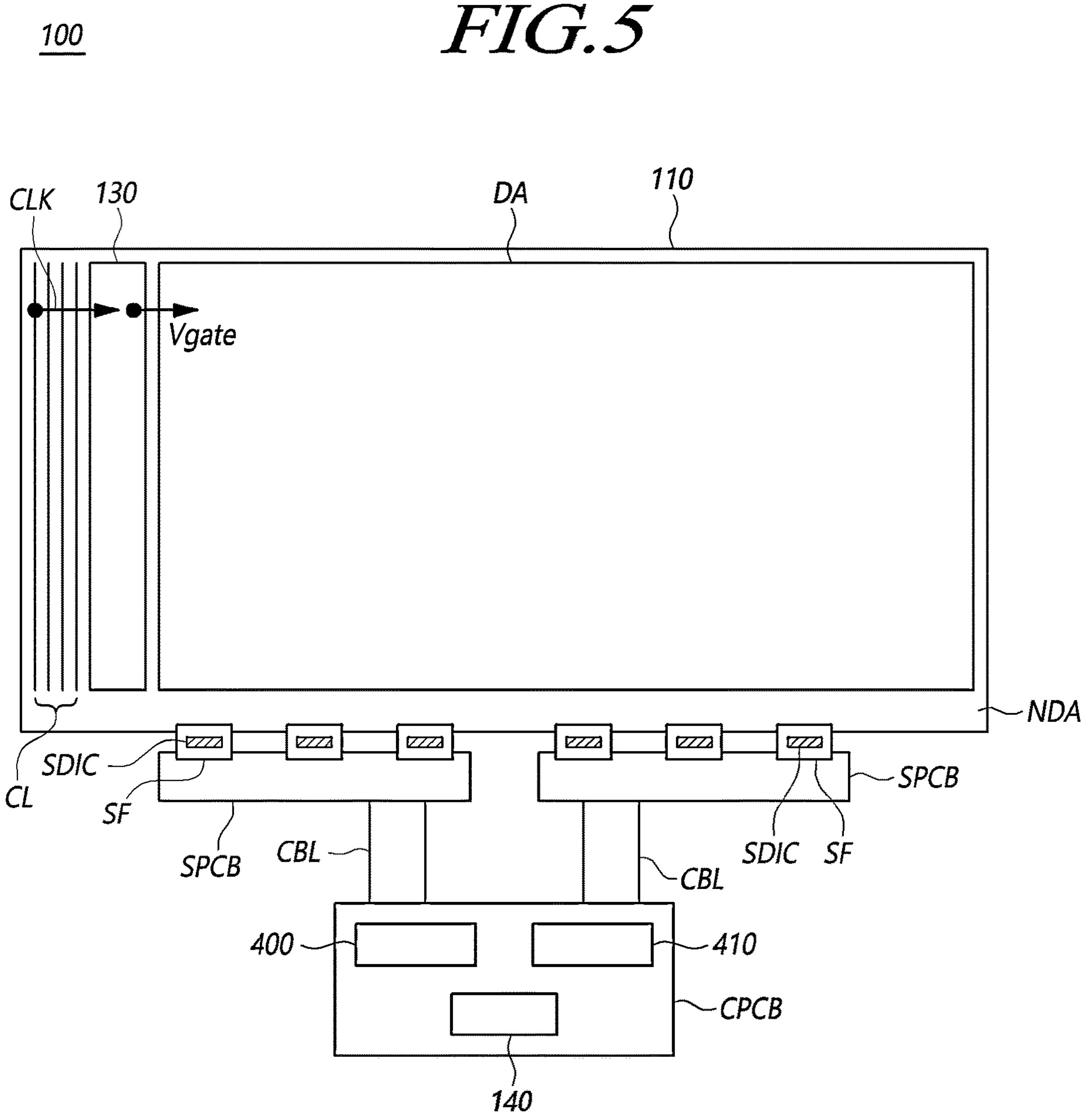
FIG. 5 illustrates another example of a system configuration of a display device according to embodiments of the present disclosure.

FIGS. 4 and 5 illustrate examples of a system configuration of a display device according to embodiments of the present disclosure.

Referring to FIGS. 4 and 5, the display panel 110 may include a display area DA in which an image is displayed and a non-display area NDA where an image is not displayed.

Referring to FIGS. 4 and 5, for example, the data driving circuit 120 may include a plurality of source driver integrated circuits SDICs, and may be implemented in a chip on film (COF) method. In this case, each source driver integrated circuit SDIC may be mounted on a circuit film SF connected to the non-display area NDA of the display panel 110.

Referring to FIGS. 4 and 5, for example, the gate driving circuit 130 may be implemented as a gate-in-panel (GIP) type, and may be formed in the non-display area NDA of the display panel 110.

Referring to FIGS. 4 and 5, for circuit connection between one or more source driver integrated circuits (SDIC) and other devices, the display device 100 may include at least one source printed circuit board SPCB and a control printed circuit board CPCB for mounting control components and various electrical devices.

A circuit film SF for mounting a source driver integrated circuit SDIC may be connected to at least one source printed circuit board SPCB. That is, the circuit film SF on which the source driver integrated circuit SDIC is mounted may have one side electrically connected to the display panel 110 and the other side electrically connected to the source printed circuit board SPCB.

A controller 140 and a power management integrated circuit PMIC 410 may be mounted on a control printed circuit board CPCB. The controller 140 may perform overall control functions related to driving the display panel 110 and may control operations of the data driving circuit 120 and the gate driving circuit 130. The power management integrated circuit 410 may supply various voltages or currents to the data driving circuit 120 and the gate driving circuit 130 or control various voltages or currents to be supplied.

At least one source printed circuit board SPCB and the control printed circuit board CPCB may be circuitically connected through at least one connection cable CBL. Here, the connection cable CBL may be, for example, a flexible printed circuit FPC or a flexible flat cable FFC.

At least one source printed circuit board SPCB and one control printed circuit board CPCB may be integrated into one printed circuit board.

The display device 100 according to embodiments of the present disclosure may further include a level shifter 400 for adjusting a voltage level. For example, the level shifter 400 may be disposed on the control printed circuit board CPCB or the source printed circuit board SPCB.

In the display device 100 according to embodiments of the present disclosure, the level shifter 400 may supply signals required for gate driving to the gate driving circuit 130.

For example, the level shifter 400 may supply a plurality of clock signals to the gate driving circuit 130. Accordingly, the gate driving circuit 130 may generate a plurality of gate signals Vgate based on the plurality of clock signals input from the level shifter 400 and output the plurality of gate signals Vgate to the plurality of gate lines GL. Here, the plurality of gate lines GL may transfer the plurality of gate signals Vgate to the sub-pixels SP disposed in the display area DA of the substrate SUB.

As described above, the gate driving circuit 130 requires a clock signal CLK to generate the gate signal Vgate to be output to the gate line GL. Accordingly, as shown in FIGS. 4 and 5, a plurality of clock signal lines CL for transferring the plurality of clock signals CLK to the gate driving circuit 130 may be provided in the non-display area NDA of the display panel 110. The plurality of clock signals may be signals having different phases from each other. The plurality of clock signal lines CL may be disposed according to the number of clock signals.

The display device 100 according to embodiments of the present disclosure may have a double gate driving structure (both sides gate driving structure) as shown in FIG. 4 or a single gate driving structure (one side gate driving structure) as shown in FIG. 5.

Referring to FIG. 4, in the case that the display device 100 according to embodiments of the present disclosure has a double gate driving structure (both sides gate driving structure), the gate driving circuit 130 may be disposed on both sides of the display area DA in the display panel 110.

If the display device 100 according to the embodiments of the present disclosure has a double gate driving structure (both sides gate driving structure), the gate driving circuit 130 may include a first gate driving circuit 130*a* disposed on one side of the display area DA and a second gate driving circuit 130*b* disposed on the other side of the display area DA. The first gate driving circuit 130*a* and the second gate driving circuit 130*b* may be disposed in the non-display area NDA or the display area DA.

Referring to FIG. 4, in the case that the display device 100 according to embodiments of the present disclosure has a double gate driving structure (both sides gate driving structure), the non-display area NDA of the display panel 110 may include a plurality of clock signal lines CL for transferring a plurality of clock signals CLK to the first gate driving circuit 130*a*, and a plurality of clock signal lines CL for transferring a plurality of clock signals CLK to the second gate driving circuit 130*b*.

The plurality of clock signals CLK transmitted to the first gate driving circuit 130*a* and the plurality of clock signals CLK transmitted to the second gate driving circuit 130*b* may be the same or different from each other.

The plurality of clock signal lines CL for transferring the plurality of clock signals CLK to the first gate driving circuit 130*a* may be disposed further outside the first gate driving circuit 130*a*. The plurality of clock signal lines CL for transferring the plurality of clock signals CLK to the second gate driving circuit 130*b* may be disposed further outside the second gate driving circuit 130*b*.

Referring to FIG. 5, in the case that the display device 100 according to the embodiments of the present disclosure has a single gate driving structure (one side gate driving structure), the gate driving circuit 130 may be disposed on one side of display area DA of the display panel 110.

If the display device 100 according to embodiments of the present disclosure has a single gate driving structure (one side gate driving structure), the display panel 110 may include a gate driving circuit 130 disposed on one side of the display area DA. The gate driving circuit 130 may be disposed in the non-display area NDA or the display area DA.

Referring to FIG. 5, in the case that the display device 100 according to the embodiments of the present disclosure has a single gate driving structure (one side gate driving structure), the non-display area NDA of the display panel 110 may include a plurality of clock signal lines CL for transferring a plurality of clock signals CLK to the gate driving circuit 130.

The plurality of clock signal lines CL for transferring the plurality of clock signals CLK to the gate driving circuit 130 may be disposed further outside the gate driving circuit 130.

Figure 6:
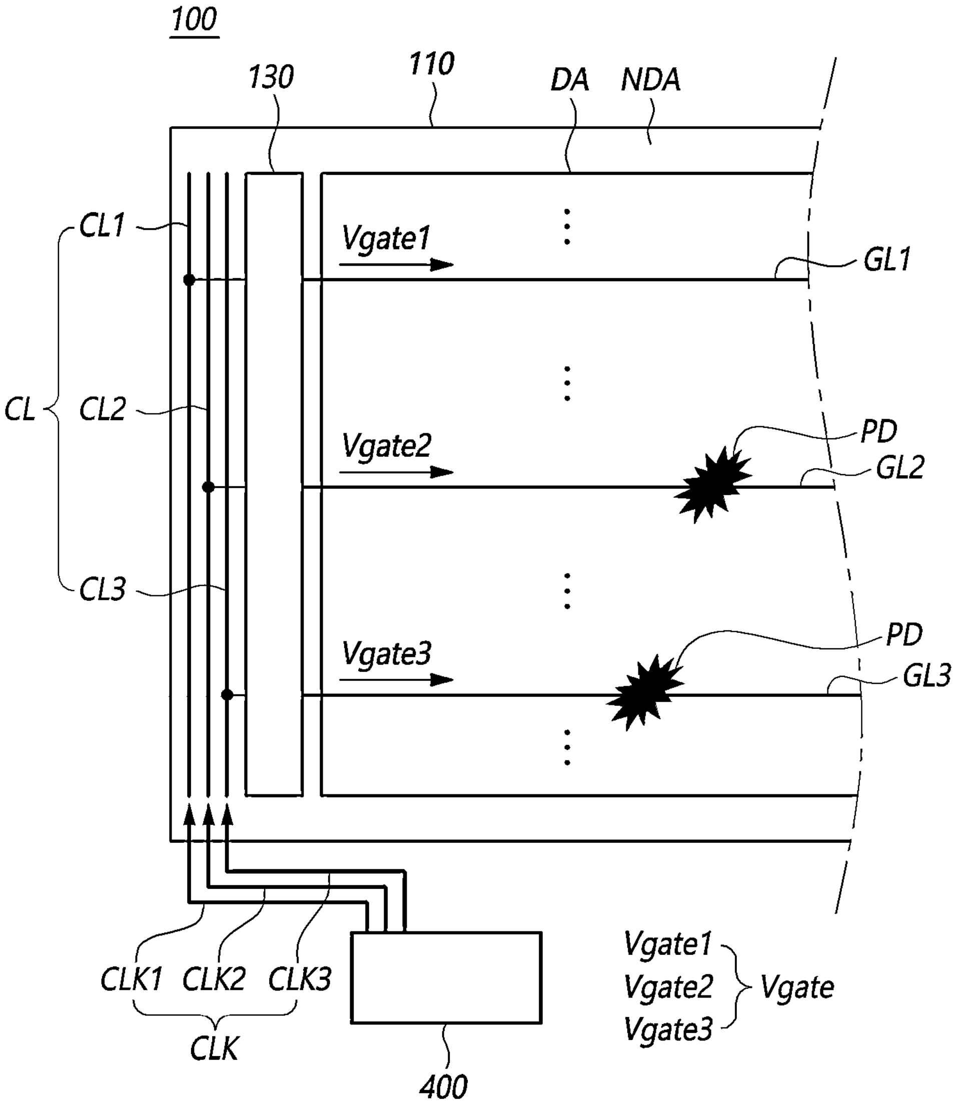
FIG. 6 illustrates a gate driving structure and panel defects in a display device according to embodiments of the present disclosure.

FIG. 6 illustrates a gate driving structure and a panel defect PD in a display device 100 according to embodiments of the present disclosure.

Referring to FIG. 6, the display device 100 according to embodiments of the present disclosure may include a level shifter 400 and a gate driving circuit 130 for gate driving.

The level shifter 400 may output a plurality of clock signals CLK. Here, the level shifter 400 may also be referred to as a "clock generation circuit."

The plurality of clock signals CLK output from the level shifter 400 may be supplied to the gate driving circuit 130 through a plurality of clock signal lines CL. The clock signal lines CL shown in FIG. 6 may be part of a plurality of clock signal lines CL to be actually disposed on the display panel 110. The plurality of clock signals CLK output from the level shifter 400 may have different phases.

The gate driving circuit 130 may receive the plurality of clock signals CLK and further receive a high level gate voltage and/or a low level gate voltage.

The gate driving circuit 130 may include a plurality of stages. Each of the plurality of stages may receive one or more clock signals CLK among the plurality of clock signals CLK, generate and output a gate signal Vgate having a turn-on level voltage at a corresponding timing.

Referring to the example of FIG. 6, a plurality of gate lines GL disposed on the display panel 110 may include a first gate line GL1, a second gate line GL2, and a third gate line GL3 for transferring a plurality of gate signals Vgate generated based on a first, second, and third clock signals CLK1, CLK2, and CLK3.

The level shifter 400 may generate and output the first, second, and third clock signals CLK1, CLK2, and CLK3 having different phases. The first, second, and third clock signals CLK1, CLK2 and CLK3 output from the level shifter 400 may be supplied to the gate driving circuit 130 through the first, second, and third clock signal lines CL1, CL2, and CL3, respectively.

Referring to FIG. 6, if a defect (hereinafter referred to as "panel defect PD") occurs in the display panel 110, the display panel 110 does not operate normally due to the panel defect PD, so that imaging defects may occur.

The term "defect" or "panel defect" may refer to any abnormality or flaw in the display panel. These defects can manifest in various ways and may affect the overall image quality and functionality of the display. As mentioned, these defects may occur due to various unexplained causes during the manufacturing process, during the shipment process, during the use by the customers (e.g., wear and tear over time). For example, the defect of the display panel may include physical damage such as cracks or fractures in the display panel. Other examples of defects include dead pixels, line defects (e.g., vertical or horizontal lines appearing on the screen, disrupting the image), color inconsistencies, image retention (or burn-in), screen uniformity issues (e.g., certain regions of the display appearing brighter or darker than others, leading to uneven lighting or brightness distribution), flickering, screen artifacts, or the like. The term "defect" also broadly includes any underlying defect that causes the above-mentioned example defects. For instance, a defect may also include abnormal signal characteristics in voltage levels or voltage variation patterns which can affect the normal functionality of a display device.

According to the panel defect shown in FIG. 6, the panel defect PD occurs on or around the second gate line GL2 and the third gate line GL3. However, the panel defect PD did not occur on or around the first gate line GL1.

According to this example, a second gate signal Vgate2 and a third gate signal Vgate3 may have abnormal signal characteristics in voltage levels or voltage variation patterns. However, the first gate signal Vgate1 may have normal signal characteristics in a voltage level or voltage variation pattern.

The inventors of the present disclosure discovered through experimentations and found that, not only the gate signal Vgate applied to the gate line GL at the location where the panel defect PD occurs, but also the clock signal CLK used to generate this gate signal Vgate has abnormal signal characteristics.

Therefore, according to the panel defect example of FIG. 6, not only the second gate signal Vgate2 and the third gate signal Vgate3, but also the second clock signal CLK2 and the third clock signal CLK3 may have abnormal signal characteristics.

Figure 7:
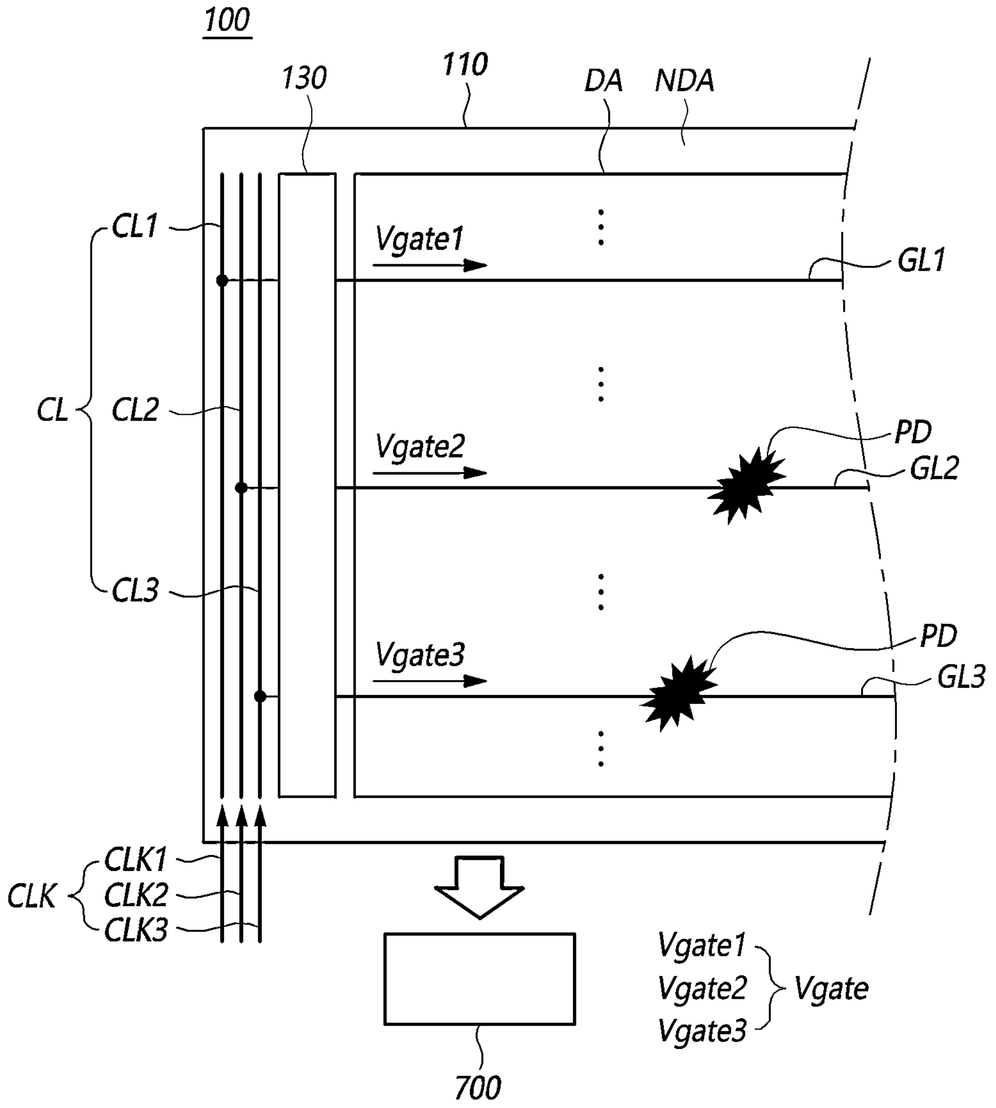
FIG. 7 illustrates a display device including a panel defect detection circuit according to embodiments of the present disclosure.

FIG. 7 illustrates a display device 100 including a panel defect detection circuit 700 according to embodiments of the present disclosure.

Referring to FIG. 7, the display device 100 according to embodiments of the present disclosure may include a display panel 110 including a plurality of gate lines GL, a gate driving circuit 130 configured to drive the plurality of gate lines GL, and a panel defect detection circuit 700 configured to detect panel defects PD of the display panel 110.

The panel defect detection circuit 700 may detect the panel defect PD of the display panel 110 by using a signal input to the gate driving circuit 130 or a signal output from the gate driving circuit 130 as a test signal.

For example, the test signal may be a "clock signal CLK" which is one type of signal input to the gate driving circuit 130 or a "gate signal Vgate" that is one type of signal output from the gate driving circuit 130. The circuit configuration of the panel defect detection circuit 700 may vary depending on the type of the test signal (e.g., clock signal CLK or gate signal Vgate).

The panel defect detection circuit 700 according to embodiments of the present disclosure may be disposed on a source printed circuit board SPCB and/or a control printed circuit board CPCB.

Hereinafter, it will be described the circuit configuration and operation of the panel defect detection circuit 700 in detail.

Figure 8:
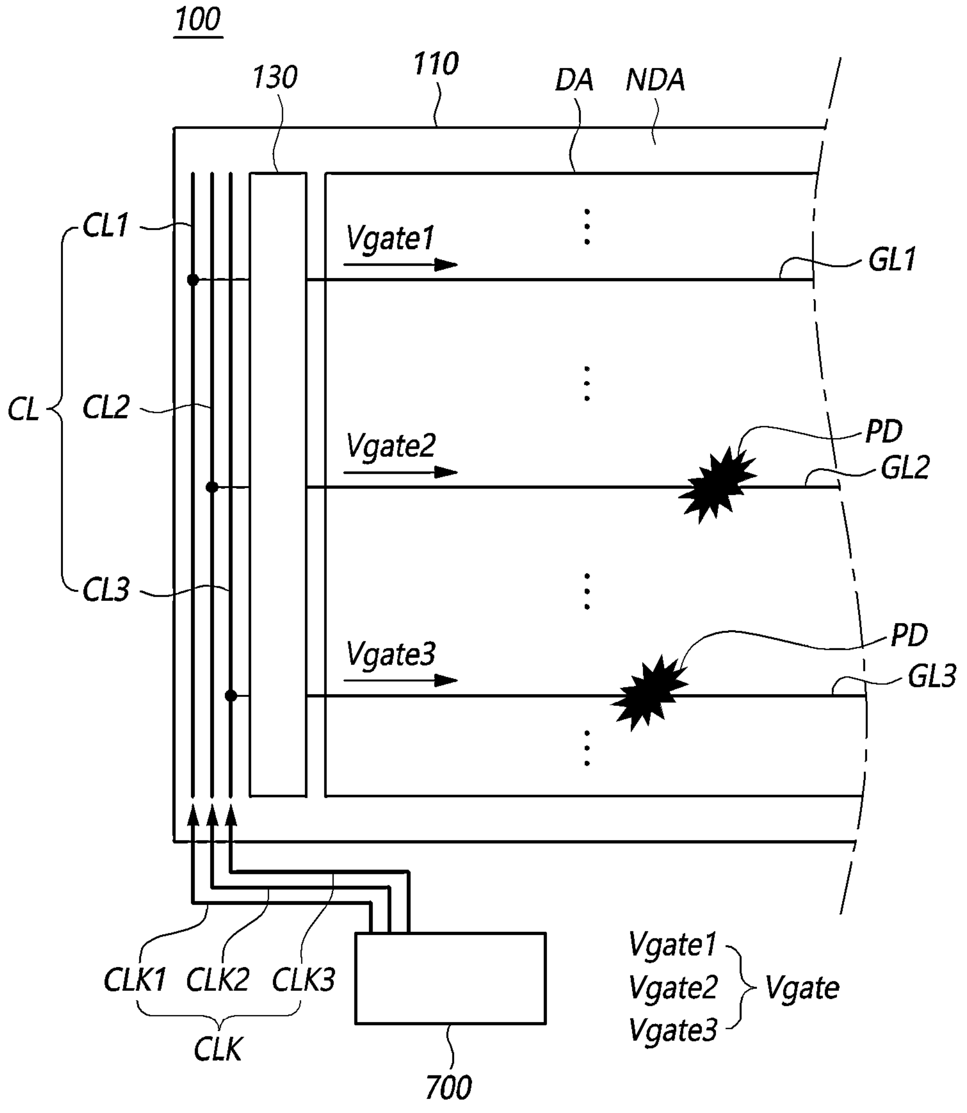
FIG. 8 illustrates a display device according to embodiments of the present disclosure, which includes a panel defect detection circuit for detecting a panel defect using clock signals.

FIG. 8 illustrates a display device 100 according to embodiments of the present disclosure, which includes a panel defect detection circuit 700 for detecting a panel defect PD using clock signals CLK.

Referring to FIG. 8, the panel defect detection circuit 700 according to the embodiments of the present disclosure may detect the panel defect PD by using the clock signals CLK, which are one type of signals input to the gate driving circuit 130, as a test signal TEST_SIG.

Referring to FIG. 8, if the test signal TEST_SIG is the clock signal CLK supplied to the gate driving circuit 130, the panel defect detection circuit 700 may be connected to a clock signal line CL for supplying the clock signal CLK to the gate driving circuit 130.

Figure 9:
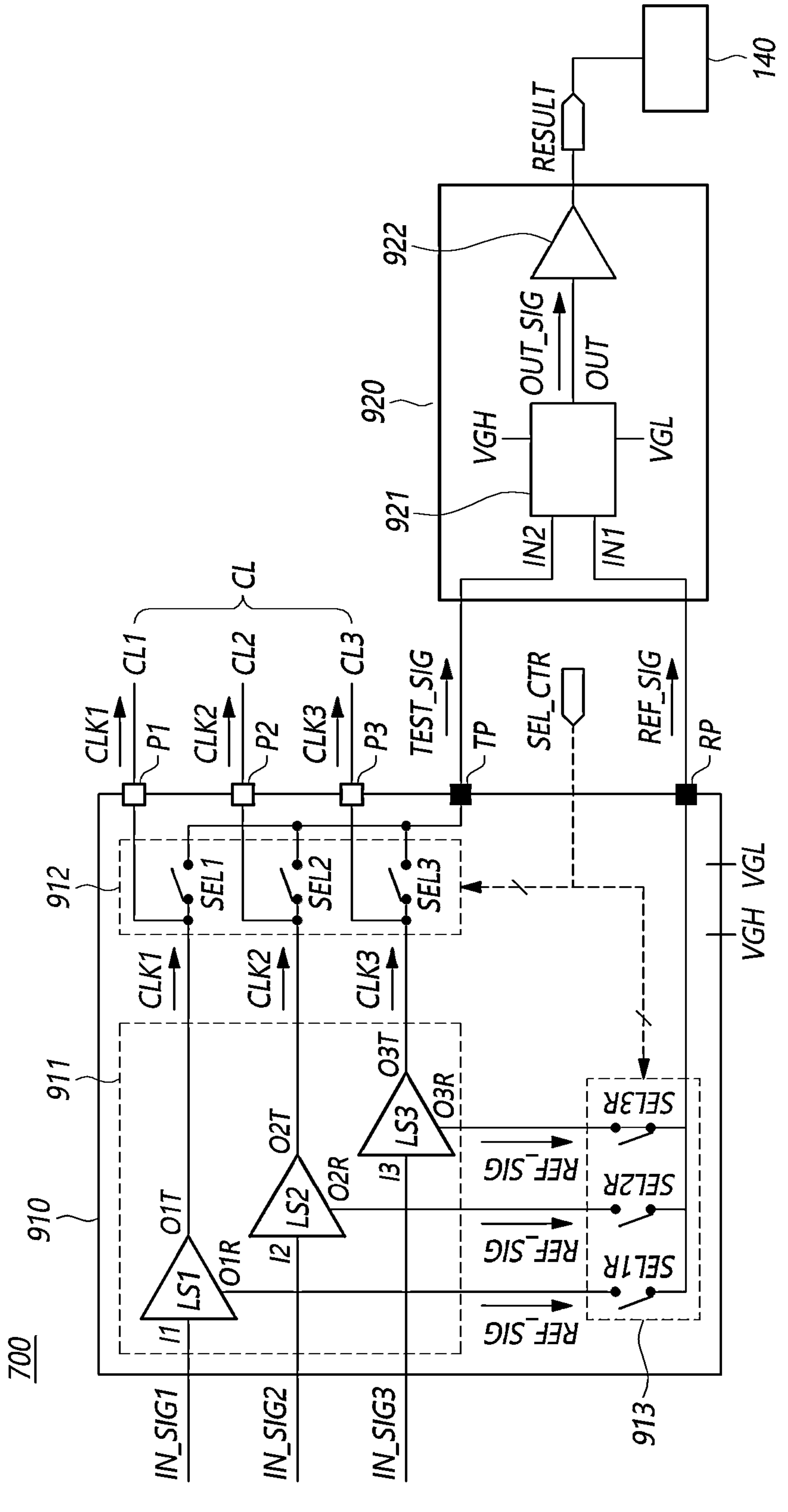
FIG. 9 illustrates a panel defect detection circuit for detecting a panel defect using clock signals according to embodiments of the present disclosure.

FIG. 9 illustrates a panel defect detection circuit 700 for detecting a panel defect PD using clock signals CLK according to embodiments of the present disclosure.

Referring to FIG. 9, a panel defect detection circuit 700 according to embodiments of the present disclosure may include a signal supply circuit 910 and a test circuit 920.

The test circuit 920 may be configured to receive a test signal TEST_SIG and a reference signal REF_SIG and output a test result signal RESULT.

The signal supply circuit 910 may be configured to supply the test signal TEST_SIG and the reference signal REF_SIG to the test circuit 920. A high level gate voltage VGH and a low level gate voltage VGL necessary for the operation of the signal supply circuit 910 may be applied to the signal supply circuit 910.

The display device 100 according to embodiments of the present disclosure may further include a controller 140 configured to control an operation of the gate driving circuit 130. The controller 140 may be configured to determine whether the display panel 110 has a panel defect by using the test result signal RESULT. The controller 140 may be included in the panel defect detection circuit 700.

Referring to FIG. 9, in the panel defect detection circuit 700 according to embodiments of the present disclosure, a test signal TEST_SIG for detecting a panel defect may be a signal input to the gate driving circuit 130. For example, the test signal TEST_SIG for detecting a panel defect may be clock signals CLK input to the gate driving circuit 130.

Referring to FIG. 9, in the panel defect detection circuit 700 according to embodiments, the test circuit 920 may include a logic circuit 921 and a level conversion circuit 922.

The logic circuit 921 may be configured to receive the reference signal REF_SIG through a first input terminal IN1, receive the test signal TEST_SIG through a second input terminal IN2, and output an output signal OUT_SIG to an output terminal OUT based on the reference signal REF_SIG and the test signal TEST_SIG.

A high level gate voltage VGH and a low level gate voltage VGL required for the operation of the logic circuit 921 may be applied to the logic circuit 921.

The level conversion circuit 922 may be configured to convert a voltage level of the output signal OUT_SIG to a selected value or less and output the voltage level-converted output signal OUT_SIG as a test result signal RESULT. Here, the selected value may correspond to a maximum voltage level that the controller 140 can handle or process. That is, the selected value is indicative of a maximum voltage level that the controller 140 can process for determining whether the display panel includes a panel defect.

The output signal OUT_SIG output from the logic circuit 921 is an analog voltage signal. Since the controller 140 is a device capable of processing digital signals, the controller may be not able to process an analog signal having an analog voltage level higher than a selected threshold. Therefore, if the output signal OUT_SIG has an analog voltage level higher than a selected threshold, the controller 140 cannot process the output signal OUT_SIG.

The level conversion circuit 922 may convert the voltage level of the output signal OUT_SIG to a voltage level (preset value) or less that the controller 140 can process, so that the controller 140 may perform accurate determination processing (processing for determining whether a panel is defective) using the test result signal RESULT.

Referring to FIG. 9, the logic circuit 921 may determine a voltage level of the output signal OUT_SIG according to a voltage level of the test signal TEST_SIG and a voltage level of the reference signal REF_SIG.

For example, the logic circuit 921 may be configured to output an output signal OUT_SIG having a low level voltage if the voltage level of the test signal TEST_SIG and the voltage level of the reference signal REF_SIG are the same. The logic circuit 921 may be configured to output an output signal OUT_SIG having a high level voltage if the voltage level of the test signal TEST_SIG and the voltage level of the reference signal REF_SIG are different from each other.

For example, the logic circuit 921 may include an exclusive OR element which receives the test signal TEST_SIG and the reference signal REF_SIG and outputs an output signal OUT_SIG.

Hereinafter, it is assumed that the logic circuit 921 includes an exclusive OR element. Accordingly, the logic circuit 921 may output an output signal OUT_SIG having a high level voltage only if the voltage levels (high level voltage or low level voltage) of the test signal TEST_SIG and the voltage levels (high level voltage or low level voltage) of the reference signal REF_SIG are different from each other.

In a first case in which the test signal TEST_SIG is a high level voltage and the reference signal REF_SIG is a low level voltage, or a second case in which the test signal TEST_SIG is a low level voltage and the reference signal REF_SIG is a high level voltage, an output signal OUT_SIG may be a high level voltage. In cases other than the first case and the second case, the output signal OUT_SIG may be a low level voltage.

In the panel defect detection circuit 700 according to embodiments of the present disclosure, the controller 140 may be configured to determine whether the display panel 110 has a panel defect based on at least one of the number and length of high level voltage periods included in the test result signal RESULT.

Hereinafter, it will be described in more detail, with reference to FIG. 9, a circuit configuration considering a case in which the test signal TEST_SIG includes first, second, and third clock signals CLK1, CLK2, and CLK3 supplied to the gate driving circuit 130, and a panel defect PD occurs on or around the second and third gate lines GL2 and GL3 among the first to third gate lines GL1, GL2 and GL3.

Referring to FIG. 9, the signal supply circuit 910 may include a signal generation circuit 911, a test signal supply circuit 912, and a reference signal supply circuit 913.

Referring to FIG. 9, the signal supply circuit 910 may further include a plurality of ports. The plurality of ports may include a first port P1 electrically connected to a first clock signal line CL1, a second port P2 electrically connected to a second clock signal line CL2, a third port P3 electrically connected to a third clock signal line CL3, a test port TP connected to the test circuit 920, and a reference port RP connected to the test circuit 920.

Referring to FIG. 9, the signal generation circuit 911 may be configured to generate and output a reference signal REF_SIG, a first clock signal CLK1, a second clock signal CLK2, and a third clock signal CLK3.

Referring to FIG. 9, the test signal supply circuit 912 may be configured to output the first clock signal CLK1, the second clock signal CLK2 and the third clock signal CLK3 to the first port P1, the second port P2 and the third port P3, respectively, and output one of the first clock signal CLK1, the second clock signal CLK2 and the third clock signal CLK3 to the test port TP as the test signal TEST_SIG.

Referring to FIG. 9, the reference signal supply circuit 913 may be configured to output the reference signal REF_SIG to the reference port RP.

Referring to FIG. 9, for example, the signal generation circuit 911 may include a first level shifter LS1 configured to change a voltage level of a first input signal IN_SIG1 to generate and output the first input signal IN_SIG1 having the changed voltage level as a first clock signal CLK1, a second level shifter LS2 configured to change a voltage level of a second input signal IN_SIG2 to generate and output the second input signal IN_SIG2 having the changed voltage level as a second clock signal CLK2, and a third level shifter LS3 configured to change a voltage level of a third input signal IN_SIG3 to generate and output the third input signal IN_SIG3 having the changed voltage level as a third clock signal CLK3.

The first level shifter LS1 may include a first input node I1 to which the first input signal IN_SIG1 is input, a first output node O1T from which the first clock signal CLK1 is output, and a first reference output node O1R from which the reference signal REF_SIG is output.

The first output node O1T may be electrically connected to the first port P1.

The second level shifter LS2 may include a second input node I2 to which the second input signal IN_SIG2 is input, a second output node O2T from which the second clock signal CLK2 is output, and a second reference output node O2R from which the reference signal REF_SIG is output.

The second output node O2T may be electrically connected to the second port P2.

The third level shifter LS3 may include a third input node I3 to which the third input signal IN_SIG3 is input, a third output node O3T from which the third clock signal CLK3 is output, and a third reference output node O3R from which the reference signal REF_SIG is output.

The third output node O3T may be electrically connected to the third port P3.

Referring to FIG. 9, for example, the reference signal supply circuit 913 may include a first reference selection switch SEL1R configured to control a connection between the first reference output node O1R and the reference port RP, a second reference selection switch SEL2R configured to control a connection between the second reference output node O2R and the reference port RP, and a third reference selection switch SEL3R configured to control a connection between the third reference output node O3R and the reference port RP.

Referring to FIG. 9, for example, by using a selection control signal SEL_CTR, a first selection switch SEL1 and the first reference selection switch SEL1R may be turned on or off at the same time, a second selection switch SEL2 and the second reference selection switch SEL2R may be turned on or off at the same time, and a third selection switch SEL3 and the third reference selection switch SEL3R may be turned on or off at the same time.

For example, the selection control signal SEL_CTR may be a control signal supplied from the controller 140 to the panel defect detection circuit 700.

In the panel defect detection circuit 700 according to embodiments of the present disclosure, the remaining components 910 and 920 except for the controller 140 may be disposed on one of a source printed circuit board SPCB and a control printed circuit board CPCB. Alternatively, some of the components 910 and 920 other than the controller 140 in the panel defect detection circuit 700 may be disposed on the source printed circuit board SPCB and others may be disposed on the control printed circuit board CPCB.

Figure 10:
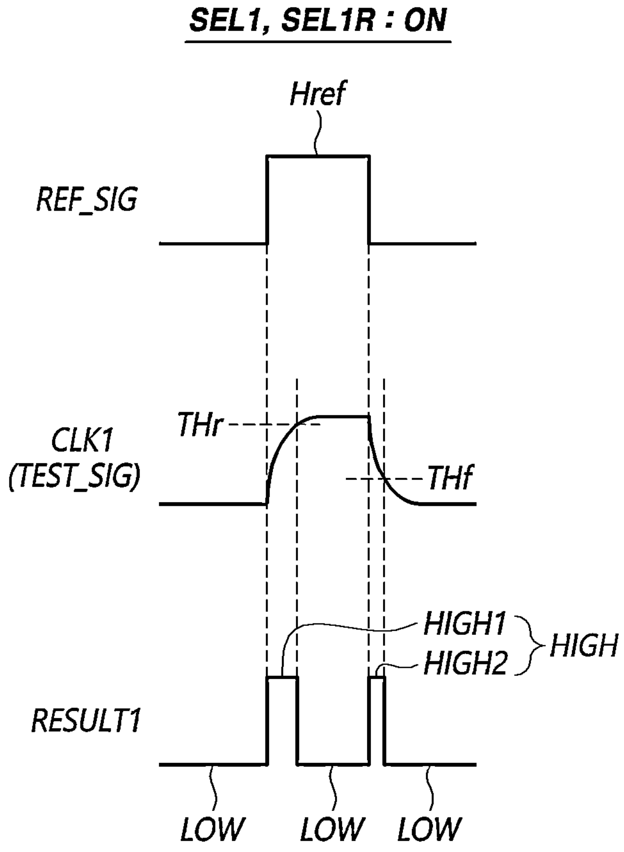
FIGS. 10 to 12 are examples of signal waveforms for explaining the operation of the panel defect detection circuit according to embodiments of the present disclosure.
Figure 11:
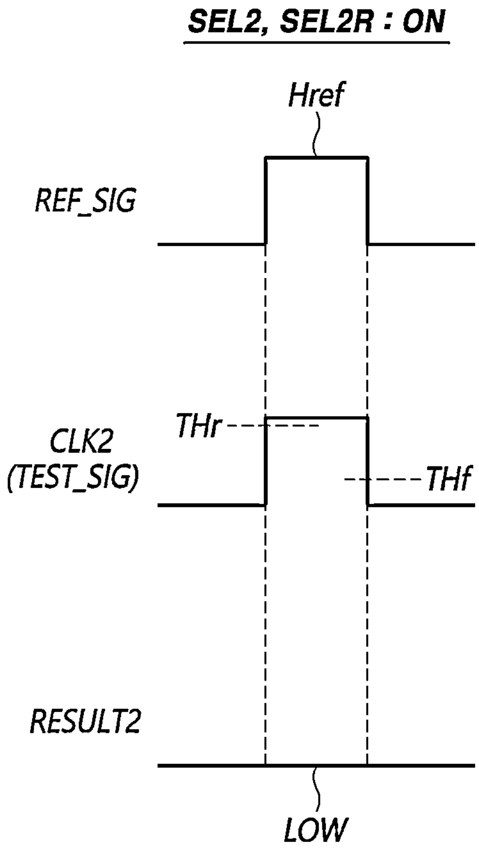
Figure 12:
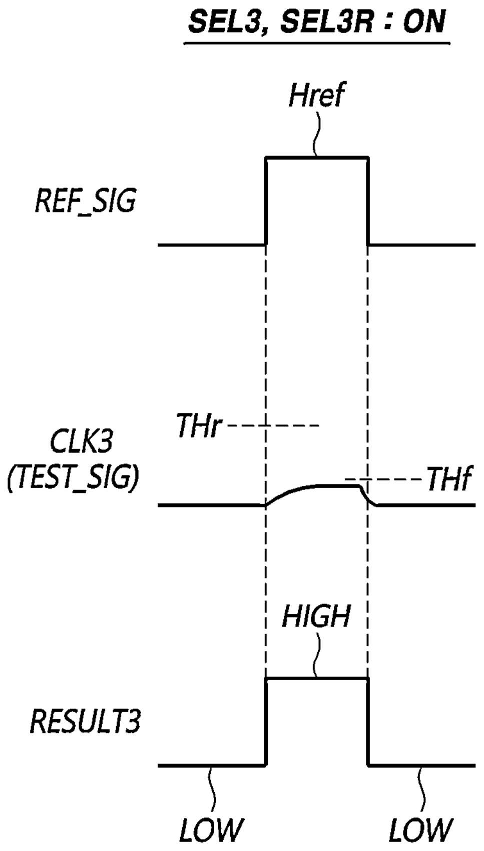

FIGS. 10 to 12 are examples of signal waveforms for explaining the operation of the panel defect detection circuit 700 according to embodiments of the present disclosure. However, in FIGS. 10 to 12, as in FIG. 8, it will be described a case as an example in which a panel defect PD occurs on or around the second and third gate lines GL2 and GL3 among the first to third gate lines GL1, GL2 and GL3.

FIG. 10 illustrates two input signals REF_SIG and TEST_SIG input to the logic circuit 921 and a first test result signal RESULT1 output from the level conversion circuit 922 in the case that the second and third selection switches SEL2 and SEL3 and the second and third reference selection switches SEL2R and SEL3R are in a turn-off state, and the first selection switch SEL1 and the first reference selection switch SEL1R are in a turn-on state.

Referring to FIG. 10, two input signals REF_SIG and TEST_SIG input to the logic circuit 921 may include a reference signal REF_SIG and a test signal TEST_SIG. The test signal TEST_SIG may be the first clock signal CLK1.

FIG. 11 illustrates two input signals REF_SIG and TEST_SIG input to the logic circuit 921 and a second test result signal RESULT2 output from the level conversion circuit 922 in the case that the first and third selection switches SEL1 and SEL3 and the first and third reference selection switches SEL1R and SEL3R are in a turn-off state, and the second selection switch SEL2 and the second reference selection switch SEL2R are in a turn-on state.

Referring to FIG. 11, two input signals REF_SIG and TEST_SIG input to the logic circuit 921 may include a reference signal REF_SIG and a test signal TEST_SIG. The test signal TEST_SIG may be the second clock signal CLK2.

FIG. 12 illustrates two input signals REF_SIG and TEST_SIG input to the logic circuit 921 and a third test result signal RESULT3 output from the level conversion circuit 922 in the case that the first and second selection switches SEL1 and SEL2 and the first and second reference selection switches SEL1R and SEL2R are in a turn-off state, and the third selection switch SEL3 and the third reference selection switch SEL3R are in a turn-on state.

Referring to FIG. 12, two input signals REF_SIG and TEST_SIG input to the logic circuit 921 may include a reference signal REF_SIG and a test signal TEST_SIG. The test signal TEST_SIG may be the third clock signal CLK3.

Referring to FIGS. 10 to 12, the signal waveform of the reference signal REF_SIG may be a perfect square wave. Therefore, the reference signal REF_SIG may be immediately changed from a low level voltage to a high level voltage without delay during rising, and may be immediately changed from a high level voltage to a low level voltage without delay during falling.

Referring to FIGS. 10 to 12, the first, second and third clock signals CLK1, CLK2 and CLK3 may be input to the panel defect detection circuit 700, and may be the test signals TEST_SIG for panel defect detection operations performed at different timings.

Referring to FIGS. 10 to 12, since the panel defects PD occur on or around the second and third gate lines GL2 and GL3 among the first to third gate lines GL1, GL2 and GL3, the first clock signal CLK1 may have a normal signal waveform, and the second and third clock signals CLK2 and CLK3 may have abnormal signal waveforms.

Referring to FIGS. 10 to 12, the rising characteristics and falling characteristics of the first, second and third clock signals CLK1, CLK2 and CLK3 may be different from each other.

Referring to FIGS. 10 to 12, a rising start time of each of the first, second and third clock signals CLK1, CLK2 and CLK3 may be a rising start time of the reference signal REF_SIG. The falling start time of each of the second and third clock signals CLK1, CLK2 and CLK3 may be a falling start time of the reference signal REF_SIG.

Referring to FIG. 10, the first clock signal CLK1 may be a signal applied to the first clock signal line CL1 disposed on the display panel 110, and may be a test signal TEST_SIG applied to the panel defect detection circuit 700. The first clock signal CLK1 has a signal waveform in which a rising delay time and a falling delay time exist due to a voltage drop.

Referring to FIG. 10, when rising, the first clock signal CLK1 may take some time (referred to as a rising delay time) to rise from a low level voltage to a high level voltage.

A rising period having a voltage level less than a first threshold voltage THr among a rising periods of the first clock signal CLK1 may be a period in which the voltage level of the first clock signal CLK1 is determined as a low level voltage. A rising period having a voltage level equal to or higher than the first threshold voltage THr among a rising periods of the first clock signal CLK1 may be a period in which the voltage level of the first clock signal CLK1 is determined as a high level voltage.

Referring to FIG. 10, when falling, the first clock signal CLK1 may take some time (referred to as a falling delay time) to fall from a high level voltage to a low level voltage.

A falling period having a voltage level equal to or higher than a second threshold voltage THf among a falling periods of the first clock signal CLK1 may be a period in which the voltage level of the first clock signal CLK1 is determined as a high level voltage. A falling period having a voltage level less than the second threshold voltage THf among a falling periods of the first clock signal CLK1 may be a period in which the voltage level of the first clock signal CLK1 is determined as a low level voltage.

The first threshold voltage THr and second threshold voltage THf may have the same voltage value. Alternatively, as shown in FIG. 10, the first threshold voltage THr and the second threshold voltage THf may have different voltage values.

Referring to FIG. 10, the first clock signal CLK1 may have a signal waveform different from that of the reference signal REF_SIG due to a rising delay characteristics and a falling delay characteristics of the first clock signal CLK1.

Referring to FIG. 10, the first clock signal CLK1 may rise to a high level voltage equal to or higher than the first threshold voltage THr while a certain amount of rising delay time exists during rising, and may be felled to a low level voltage less than the second threshold voltage THf while a certain falling delay time exists during falling. The first test result signal RESULT1 generated based on the first clock signal CLK1 and the reference signal REF_SIG may have two high level voltage periods HIGH separated by a low level voltage period LOW.

Referring to FIG. 10, a first high level voltage period HIGH1 of the first test result signal RESULT1 may correspond to a rising period having a voltage less than the first threshold voltage THr among the rising periods of the first clock signal CLK1 as the test signal TEST_SIG.

Among the rising periods of the first clock signal CLK1 which is the test signal TEST_SIG, a rising period having a voltage less than the first threshold voltage THr may be a period determined with a low level voltage.

Among the rising periods of the first clock signal CLK1 which is the test signal TEST_SIG, a rising period having a voltage equal to or higher than the first threshold voltage THr may be a period determined with a high level voltage.

Referring to FIG. 10, the start time of the first high level voltage period HIGH1 in the first test result signal RESULT1 may correspond to the start time of a high level voltage period Href of the reference signal REF_SIG.

Referring to FIG. 10, a length of the first high level voltage period HIGH1 of the first test result signal RESULT1 may be shorter than a length of the high level voltage period Href of the reference signal REF_SIG.

Referring to FIG. 10, a second high level voltage period HIGH2 of the first test result signal RESULT1 may correspond to a falling period having a voltage equal to or higher than the second threshold voltage THf among the falling periods of the first clock signal CLK1 as the test signal TEST_SIG.

Among the falling periods of the first clock signal CLK1 which is the test signal TEST_SIG, a falling period having a voltage equal to or higher than the second threshold voltage THf may be a period determined with a high level voltage.

Among the falling periods of the first clock signal CLK1 which is the test signal TEST_SIG, a falling period having a voltage less than the second threshold voltage THf may be a period determined with a low level voltage.

Referring to FIG. 10, the start time of the second high level voltage period HIGH2 of the first test result signal RESULT1 may correspond to an end time of the high level voltage period Href of the reference signal REF_SIG.

Referring to FIG. 10, a length of the second high level voltage period HIGH2 of the first test result signal RESULT1 may be shorter than a length of the high level voltage period Href of the reference signal REF_SIG.

Referring to FIG. 11, the second clock signal CLK2 is a signal applied to the second clock signal line CL2 disposed on the display panel 110, and may be the test signal TEST_SIG applied to the panel defect detection circuit 700. The second clock signal CLK2 has a signal waveform in which a rising delay time and a falling delay time hardly exist due to little voltage drop.

Referring to FIG. 11, the second clock signal CLK2 may immediately rise from a low level voltage to a high level voltage without delay during rising. The second clock signal CLK2 may immediately fall from a high level voltage to a low level voltage without delay during falling.

Referring to FIG. 11, the second clock signal CLK2 may have the same or almost the same signal waveform as the reference signal REF_SIG due to the above-described immediate rising and immediate falling characteristics of the second clock signal CLK2.

Since the second clock signal CLK2 has the same or almost the same signal waveform as the reference signal REF_SIG, the second clock signal CLK2 may have the same voltage level as the reference signal REF_SIG at all time period.

Accordingly, during a period in which the second clock signal CLK2 is input to the panel defect detection circuit 700, The second test result signal RESULT2 generated according to a voltage level of the second clock signal CLK2 and a voltage level of the reference signal REF_SIG may not have a high level voltage but only a low level voltage.

That is, while the second clock signal CLK2 is input as the test signal TEST_SIG to the panel defect detection circuit 700, the second test result signal RESULT2 may have only a low level voltage period LOW without a high level voltage period HIGH.

Referring to FIG. 12, the third clock signal CLK3 is a signal applied to a third clock signal line CL3 disposed on the display panel 110, and may be a test signal TEST_SIG applied to the panel defect detection circuit 700. The third clock signal CLK3 may have a signal waveform with a large rising delay time due to a large voltage drop.

Referring to FIG. 12, during a rising period, the third clock signal CLK3 may not rise to a high level voltage equal to or higher than the first threshold voltage THr and may have a voltage lower than the first threshold voltage THr due to a large rising delay time. In addition, during the rising period, the third clock signal CLK3 may have a voltage lower than the second threshold voltage THf. Accordingly, the third clock signal CLK3 may be felled to a low level voltage from a voltage lower than the first threshold voltage THr and the second threshold voltage THf.

Referring to FIG. 12, due to the rising and falling characteristics of the third clock signal CLK3, the third clock signal CLK3 may be determined as having a low level voltage during a period in which the reference signal REF_SIG has a high level voltage.

Accordingly, during a period in which the third clock signal CLK3 is input to the panel defect detection circuit 700, the third test result signal RESULT3 generated based on a voltage level of the third clock signal CLK3 and the voltage level of the reference signal REF_SIG may have the same signal waveform as that of the reference signal REF_SIG. Accordingly, the third test result signal RESULT3 may have one high level voltage period HIGH.

Referring to FIG. 12, the start time of the high level voltage period HIGH of the third test result signal RESULT3 may correspond to a start time of the high level voltage period Href of the reference signal REF_SIG.

Referring to FIG. 12, an end time of the high level voltage period HIGH of the third test result signal RESULT3 may correspond to an end time of the high level voltage period Href of the reference signal REF_SIG.

Referring to FIG. 12, a length of the high level voltage period HIGH of the third test result signal RESULT3 may correspond to the length of the high level voltage period Href of the reference signal REF_SIG.

If the first to third test result signals RESULT1, RESULT2 and RESULT3 as shown in FIGS. 10 to 12 are transmitted to the controller 140, the controller 140 may determine whether the panel has a defect based on the first to third test result signals RESULT1, RESULT2 and RESULT3. Hereinafter, it will be described the panel defect determination process based on the test result signal RESULT in more detail.

Figure 13:
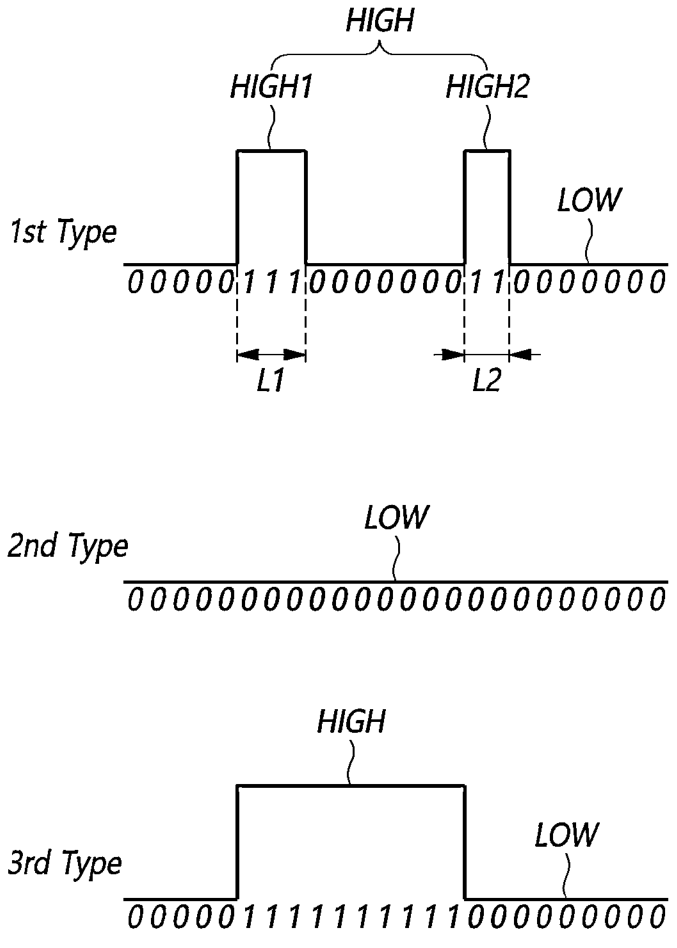
FIG. 13 illustrates test result signals of a panel defect detection circuit according to embodiments of the present disclosure.

FIG. 13 illustrates test result signals RESULT of a panel defect detection circuit 700 according to embodiments of the present disclosure.

The controller 140 may determine whether a panel defect PD exists based on the received test result signal RESULT. For example, the controller 140 determines whether a panel defect PD exists in the display panel 110 or a position of a panel defect PD based on at least one of the number and length of the high level voltage period included in the test result signal RESULT.

Referring to FIG. 13, the test result signal RESULT may be one of a first type, a second type, and a third type.

Referring to FIG. 13, in the case that the test result signal RESULT has two high level voltage periods HIGH, the test result signal RESULT may be of the first type.

If the test result signal RESULT is of the first type, the two high level voltage periods HIGH may include a first high level voltage period HIGH1 and a second high level voltage period HIGH2. The first high level voltage period HIGH1 and the second high level voltage period HIGH2 may be separated by a low level voltage period LOW. That is, the low level voltage period LOW may exist between the first high level voltage period HIGH1 and the second high level voltage period HIGH2.

For example, the first test result signal RESULT1 in FIG. 10 may be a test result signal RESULT of a first type.

Referring to FIG. 13, if the test result signal RESULT does not have a high level voltage period HIGH, the test result signal RESULT may be of the second type.

In the case that the test result signal RESULT is of the second type, the test result signal RESULT may not have a high level voltage period HIGH but only a low level voltage period LOW.

For example, the second test result signal RESULT2 in FIG. 11 may be a test result signal RESULT of the second type.

Referring to FIG. 13, if the test result signal RESULT has one high level voltage period HIGH, the test result signal RESULT may be of a third type.

In the case that the test result signal RESULT is of the third type, the test result signal RESULT may have one high level voltage period HIGH, and may correspond to the reference signal REF_SIG.

For example, the third test result signal RESULT3 in FIG. 12 may be a test result signal RESULT of the third type.

Referring to FIG. 13, in the case that the test result signal RESULT does not include a high level voltage period HIGH (i.e., second type) or the test result signal RESULT includes one high level voltage period HIGH (i.e., third type), the controller 140 may be configured to determine an abnormal test result signal RESULT and to determine that a panel defect PD has occurred in the display panel 110.

Referring to FIG. 13, if the test result signal RESULT includes two high level voltage periods HIGH separated by a low level voltage period LOW, the controller 140 may not immediately determine whether a panel defect PD has occurred, and may determine whether the panel defect PD exists in the display panel 110 based on the respective lengths L1 and L2 of the first high level voltage period HIGH1 and the second high level voltage period HIGH2 included in the two high level voltage periods HIGH. This will be described in detail with reference to FIGS. 14A and 14B.

Referring to FIG. 13, the controller 140 is a device capable of processing a digital signal, and may recognize a voltage level of the test result signal RESULT as one of a high level value '1' and a low level value '0' according to a selected timing.

Referring to FIG. 13, the controller 140 may recognize a first period among periods with the consecutive high level values 1 as a first high level voltage period HIGH1. That is, the controller 140 may determine a signal period from the first occurrence of a high level value 1 to the high level value 1 just before the low level value 0 (signal period in which the high level value 1 is continuous) as the first high level voltage period HIGH1.

The controller 140 may recognize the number of consecutive high level values 1 in the first high level voltage period HIGH1 as a length L1 of the first high level voltage period HIGH1. That is, the controller 140 may recognize the number of consecutive high level values 1 from the first occurrence of the high level value 1 to the high level value 1 just before the low level value 0 as the length L1 of the first high level voltage period HIGH1.

Referring to FIG. 13, the controller 140 may recognize a second period among periods with the consecutive high level values 1 as a second high level voltage period HIGH2. That is, the controller 140 may determine a signal period from the reappearance of the high level value 1 after the first high level voltage period HIGH1 to the high level value 1 just before the low level value 0 (signal period in which the high level value 1 is continuous) as the second high level voltage period HIGH2.

The controller 140 may recognize the number of consecutive high level values 1 in the second high level voltage period HIGH2 as a length L2 of the second high level voltage period HIGH2.

Figure 14A:
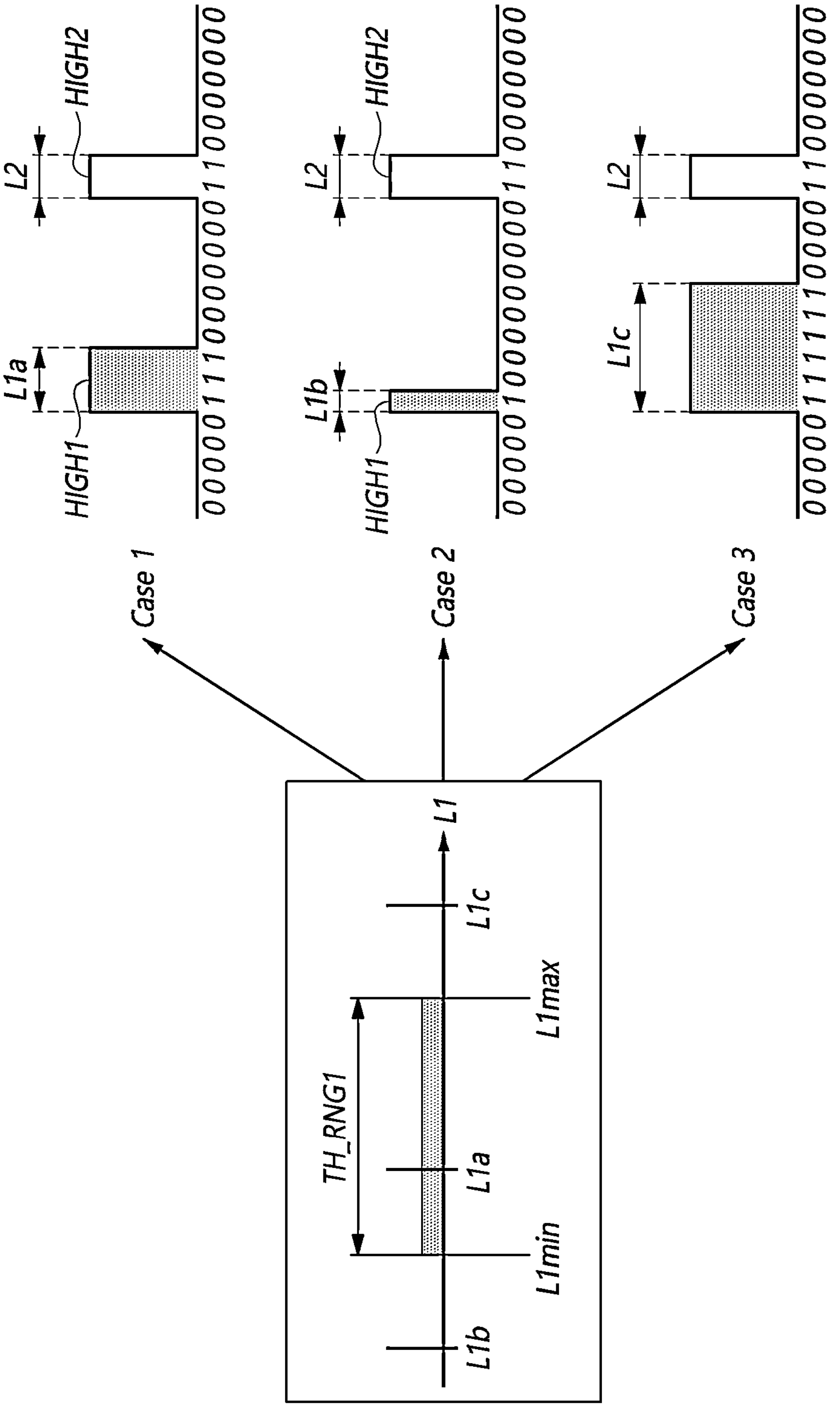
FIGS. 14A and 14B illustrate the test result signals output from a panel defect detection circuit according to embodiments of the present disclosure, and illustrate the test result signals having two high level voltage periods.
Figure 14B:
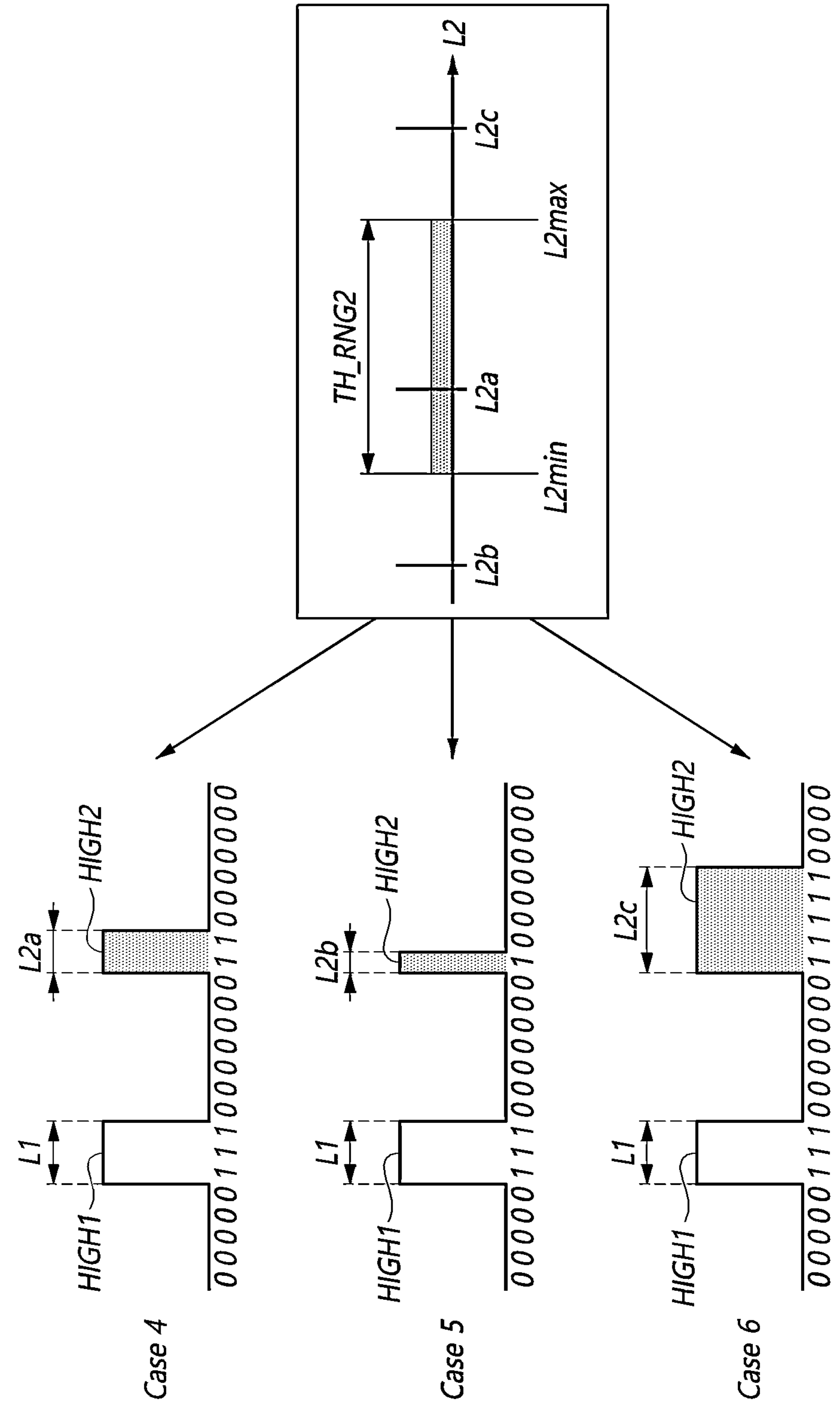

FIGS. 14A and 14B illustrate the test result signals RESULT output from a panel defect detection circuit 700 according to embodiments of the present disclosure, and illustrate the test result signals RESULT having two high level voltage periods HIGH.

Referring to FIGS. 14A and 14B, in the case that the test result signal RESULT includes two high level voltage periods HIGH, the controller 140 may determine the lengths L1 and L2 of each of the first high level voltage period HIGH1 and the second high level voltage period HIGH2 included in the two high level voltage periods HIGH, and may determine whether the test result signal RESULT is normal and whether a panel defect PD has occurred based on this.

Referring to FIGS. 14A and 14B, in the case that the test result signal RESULT includes a first high level voltage period HIGH1 having a length L1 within the first threshold range TH_RNG1 and a second high level voltage period HIGH2 having a length L2 within the second threshold range TH_RNG2 (Case 1 & Case 4), the controller 140 may determine that the display panel 110 has no panel defect PD.

That is, if the controller 140 determines that both a first condition (Case 1) in which the length L1 of the first high level voltage period HIGH1 is within the first threshold range TH_RNG1 and a second condition (Case 4) in which the length L2 of the second high level voltage period HIGH2 is within the second threshold range TH_RNG2 are satisfied, the controller 140 may determine that the test result signal RESULT is normal and determine that no panel defect PD has occurred in the display panel 110.

In the case that the controller 140 determines that at least one of the first condition (Case 1) in which the length L1 of the first high level voltage period HIGH1 is within the first threshold range TH_RNG1 and the second condition (Case 4) in which the length L2 of the second high level voltage period HIGH2 is within the second threshold range TH_RNG2 is not satisfied, the controller 140 may determine that the test result signal RESULT is abnormal and determine that a panel defect PD has occurred in the display panel 110.

Referring to FIG. 14A, the length L1 of the first high level voltage period HIGH1 among the first high level voltage period HIGH1 and the second high level voltage period HIGH2 included in the test result signal RESULT may be one of three cases (Case 1, Case 2, Case 3).

In a first case (Case 1), the length L1 of the first high level voltage period HIGH1 is a value L1*a* within the first threshold range TH_RNG1. Here, the first threshold range TH_RNG1 may mean a range greater than or equal to a first minimum value L1 min and less than or equal to a first maximum value L1max.

In a second case (Case 2), the length L1 of the first high level voltage period HIGH1 is out of the first threshold range TH_RNG1, and has a value L1*b* less than the first minimum value L1 min.

In a third case (Case 3), the length L1 of the first high level voltage period HIGH1 is out of the first threshold range TH_RNG1, and has a value L1*c* exceeding the first maximum value L1max.

Referring to FIG. 14B, the length L2 of the second high level voltage period HIGH2 among the first high level voltage period HIGH1 and the second high level voltage period HIGH2 included in the test result signal RESULT may be one of three cases (Case 4, Case 5, Case 6).

In a fourth case (Case 4), the length L2 of the second high level voltage period HIGH2 is a value L2*a* within the second threshold range TH_RNG2. Here, the second threshold range TH_RNG2 may mean a range greater than or equal to a second minimum value L2min and less than or equal to a second maximum value L2max.

In a fifth case (Case 5), the length L2 of the second high level voltage period HIGH2 is out of the second threshold range TH_RNG1, and has a value L2*b* less than the second minimum value L2 min.

In a sixth case (Case 6), the length L2 of the second high level voltage period HIGH2 is out of the second threshold range TH_RNG2, and has a value L2*c* exceeding the second maximum value L2max.

Referring to FIGS. 14A and 14B, the lengths L1 and L2 of the first high level voltage period HIGH1 and the second high level voltage period HIGH2 included in the test result signal RESULT may be expressed as the number of consecutive high level values '1' or a conversion value corresponding to the number of consecutive high level values '1'.

A panel defect detection circuit 700 and method for detecting a panel defect PD using a signal (e.g., a clock signal) input to the gate driving circuit 130 may be applied to both the double gate driving structure of FIG. 4 (both sides gate driving structure) and the single gate driving structure of FIG. 5 (one side gate driving structure).

In the above, there has been described the panel defect detection circuit 700 and method for detecting the panel defect PD using the clock signal CLK input to the gate driving circuit 130 as the test signal TEST_SIG.

Hereinafter, it will be described a panel defect detection circuit 700 and a method for detecting a panel defect PD by using a gate signal Vgate output from the gate driving circuit 130 as a test signal TEST_SIG. The overlapping contents may be omitted and the new contents are mainly explained.

Figure 15:
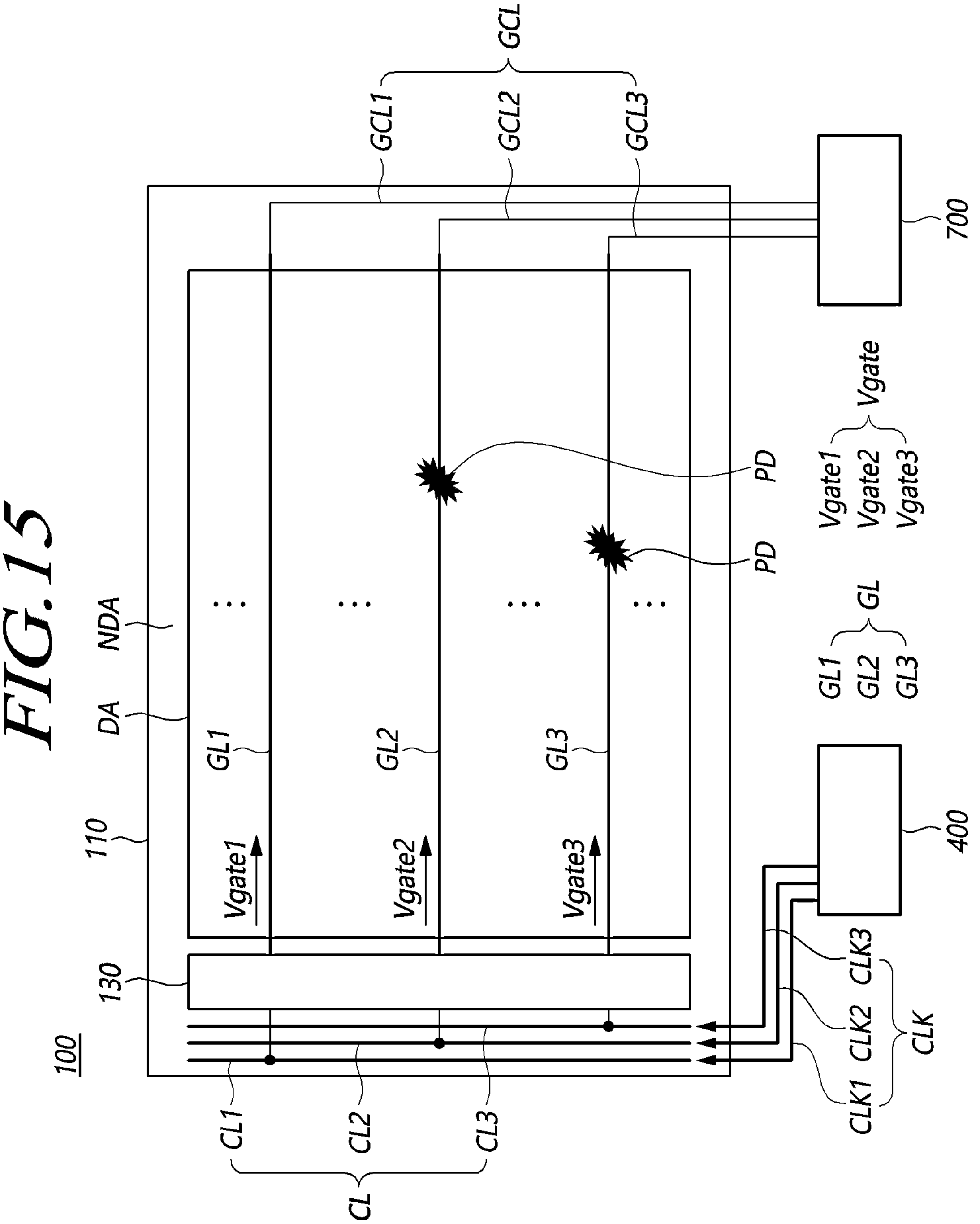
FIG. 15 illustrates a display device including a panel defect detection circuit for detecting a panel defect using gate signals according to embodiments of the present disclosure.

FIG. 15 illustrates a display device 100 including a panel defect detection circuit 700 for detecting a panel defect PD using gate signals Vgate according to embodiments of the present disclosure.

Referring to FIG. 15, the panel defect detection circuit 700 according to the embodiments of the present disclosure may detect whether or not the panel defect PD has occurred or a position of the panel defect PD by using the gate signals Vgate output from the gate driving circuit 130 to all the gate lines GL one by one.

Referring to FIG. 15, the plurality of gate lines GL disposed on the display panel 110 may include a first gate line GL1, a second gate line GL2, and a third gate line GL3 for transferring a plurality of gate signals generated based on different clock signals CLK.

Referring to FIG. 15, a first gate signal Vgate1 generated based on the first clock signal CLK1 in the gate driving circuit 130 may be applied to the first gate line GL1, a second gate signal Vgate2 generated based on the second clock signal CLK2 in the gate driving circuit 130 may be applied to the second gate line GL2, and a third gate signal Vgate3 generated based on the third clock signal CLK3 in the gate driving circuit 130 may be applied to the third gate line GL3.

According to a panel defect example of FIG. 15, the panel defect PD has occurred on or around the second gate line GL2 and the third gate line GL3. However, the panel defect PD does not occur on or around the first gate line GL1.

Referring to FIG. 15, in the case that the panel defect detection circuit 700 according to embodiments of the present disclosure detects a panel defect PD using gate signals Vgate, which is a signal output from the gate driving circuit 130, the panel defect detection circuit 700 may be electrically connected to the gate lines GL.

Referring to FIG. 15, the panel defect detection circuit 700 may be electrically connected to the gate lines GL through gate connection lines GCL. For example, the panel defect detection circuit 700 may be electrically connected to the first, second and third gate lines GL1, GL2 and GL3 through a first, second and third gate connection lines GCL1, GCL2 and GCL3, respectively.

Figure 16:
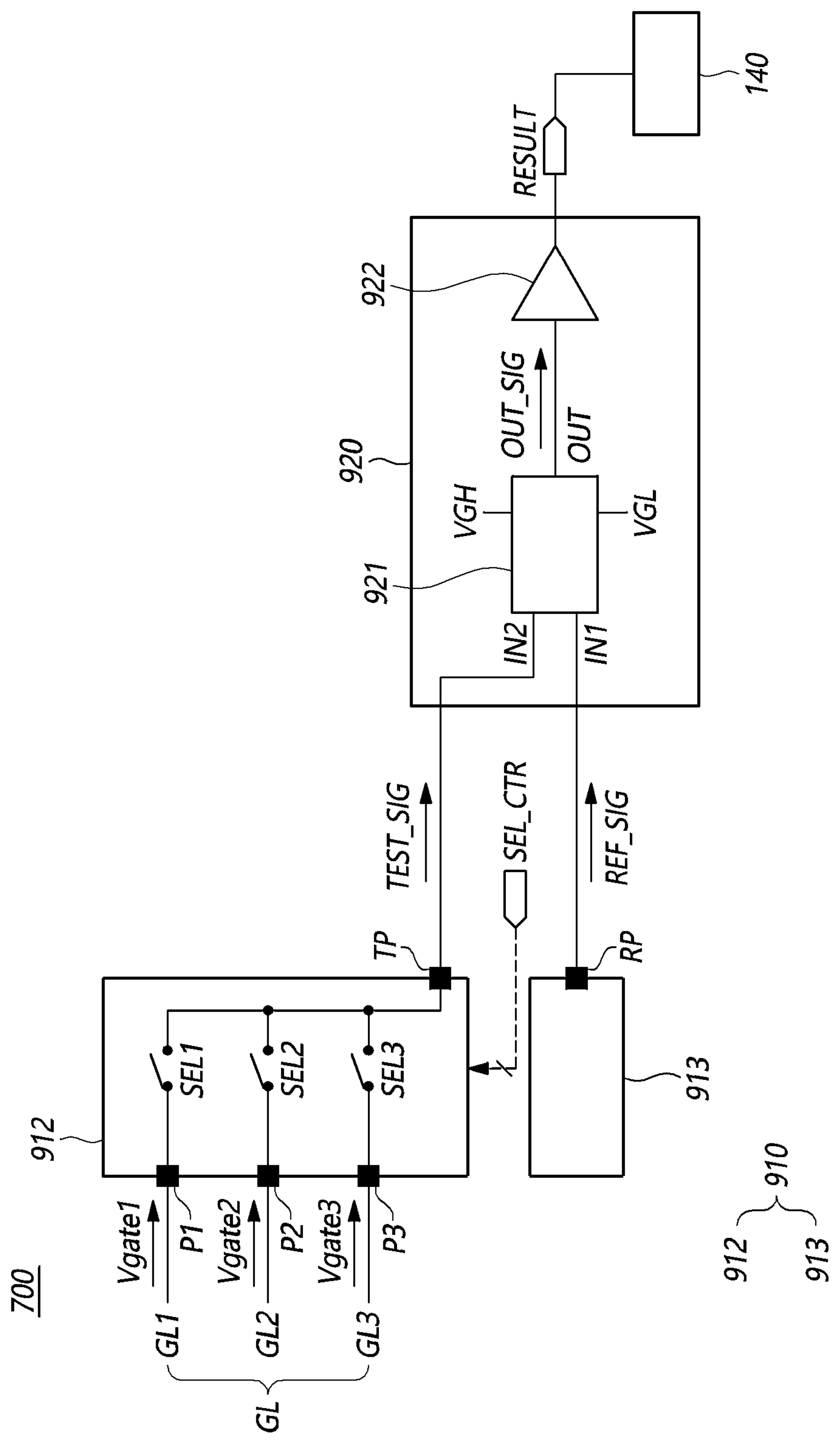
FIG. 16 illustrates a panel defect detection circuit for detecting a panel defect using gate signals according to embodiments of the present disclosure.

FIG. 16 illustrates a panel defect detection circuit 700 for detecting a panel defect PD using gate signals Vgate according to embodiments of the present disclosure.

Referring to FIG. 16, the panel defect detection circuit 700 may include a test circuit 920 configured to receive a test signal TEST_SIG and a reference signal REF_SIG and output a test result signal RESULT, and a signal supply circuit 910 configured to supply the test signal TEST_SIG and the reference signal REF_SIG to the test circuit 920.

The test signal TEST_SIG may be a signal output from the gate driving circuit 130.

For example, the test signal TEST_SIG may be a gate signal Vgate generated by the gate driving circuit 130 based on the clock signal CLK and outputted to one of the plurality of gate lines GL.

In the case that the test signal TEST_SIG is the gate signal Vgate output from the gate driving circuit 130 to the gate line GL, the signal supply circuit 910 of the panel defect detection circuit 700 may be electrically connected to the gate line GL through which the gate signal Vgate is output from the gate driving circuit 130.

For example, the test signal TEST_SIG may be a gate signal (one of Vgate1, Vgate2, and Vgate3) output from the gate driving circuit 130 to one of the first to third gate lines GL1, GL2, and GL3. In this case, the signal supply circuit 910 of the panel defect detection circuit 700 may be electrically connected to one of the first to third gate lines GL1, GL2 and GL3.

Referring to FIG. 16, the test circuit 920 may include a logic circuit 921 configured to receive the test signal TEST_SIG and the reference signal REF_SIG and output an output signal OUT_SIG.

The logic circuit 921 may determine a voltage level of the output signal OUT_SIG according to a voltage level of the test signal TEST_SIG and a voltage level of the reference signal REF_SIG.

For example, if the voltage level of the test signal TEST_SIG and the voltage level of the reference signal REF_SIG are the same, the logic circuit 921 may output an output signal OUT_SIG having a low level voltage. The logic circuit 921 may output an output signal OUT_SIG having a high level voltage if the voltage level of the test signal TEST_SIG and the voltage level of the reference signal REF_SIG are different from each other.

For example, the logic circuit 921 may include at least one exclusive OR element.

Referring to FIG. 16, the signal supply circuit 910 may include a test signal supply circuit 912 and a reference signal supply circuit 913.

As shown in FIG. 16, the test signal supply circuit 912 and the reference signal supply circuit 913 may be configured as separate circuit blocks. In some cases, the test signal supply circuit 912 and the reference signal supply circuit 913 may be configured as one circuit block.

Referring to FIG. 16, the test signal supply circuit 912 may include a first port P1, a second port P2 and a third port P3 electrically connected to the first gate line GL, the second gate line GL and the third gate line GL, respectively.

Referring to FIG. 16, the test signal supply circuit 912 may include a test port TP connected to the test circuit 920, and the reference signal supply circuit 913 may include a reference port RP connected to the test circuit 920.

Referring to FIG. 16, the test signal supply circuit 912 may be configured to output a gate signal (one of Vgate1, Vgate2 and Vgate3) applied to one of the first port P1, the second port P2 and the third port P3 to the test port TP as the test signal TEST_SIG.

Referring to FIG. 16, the reference signal supply circuit 913 may be configured to output the reference signal REF_SIG to the reference port RP.

Referring to FIG. 16, the test signal supply circuit 912 may include a first selection switch SEL1 configured to control a connection between the first port P1 and the test port TP, a second selection switch SEL2 configured to control a connection between the second port P2 and the test port TP, and a third selection switch SEL3 configured to control a connection between the third port P3 and the test port TP.

Referring to FIG. 16, for example, the first selection switch SEL1, the second selection switch SEL2, and the third selection switch SEL3 may be controlled to be turned on and off by a selection control signal SEL_CTR. For example, the selection control signal SEL_CTR may be a control signal supplied from the controller 140 to the panel defect detection circuit 700.

Referring to FIG. 16, the logic circuit 921 may determine a voltage level of the output signal OUT_SIG according to the voltage level of the reference signal REF_SIG input to a first input terminal IN2 and the voltage level of the test signal TEST_SIG input to a second input terminal IN2, and output the output signal OUT_SIG having the determined voltage level to an output terminal OUT.

Referring to FIG. 16, the test circuit 920 may further include a level conversion circuit 922 configured to convert the voltage level of the output signal OUT_SIG to a selected value or less and output a voltage level-converted output signal OUT_SIG as the test result signal RESULT. Here, the selected value may correspond to a maximum voltage level that the controller 140 can handle or process.

The output signal OUT_SIG output from the logic circuit 921 is an analog voltage signal. Since the controller 140 is a device capable of processing digital signals, the controller cannot process analog signals having a high analog voltage level. Therefore, if the output signal OUT_SIG has too high analog voltage level, the controller 140 may not be able to process the output signal OUT_SIG.

The voltage level of the output signal OUT_SIG is converted by the level conversion circuit 922 to a voltage level (selected value) or less that the controller 140 can handle or process, so that the controller 140 may perform accurate determination processing (i.e., processing for determining whether a panel is defective) using the test result signal RESULT.

Referring to FIG. 16, a high level gate voltage VGH and a low level gate voltage VGL necessary for an operation of the logic circuit 921 may be applied to the logic circuit 921.

Referring to FIG. 16, the panel defect detection circuit 700 may be configured to control the operation of the gate driving circuit 130, and may further include a controller 140 configured to determine whether a panel defect exists in the display panel 110.

The controller 140 may be configured to determine whether the display panel 110 has a panel defect based on at least one of the number and length of high level voltage periods included in the test result signal RESULT.

Figure 17:
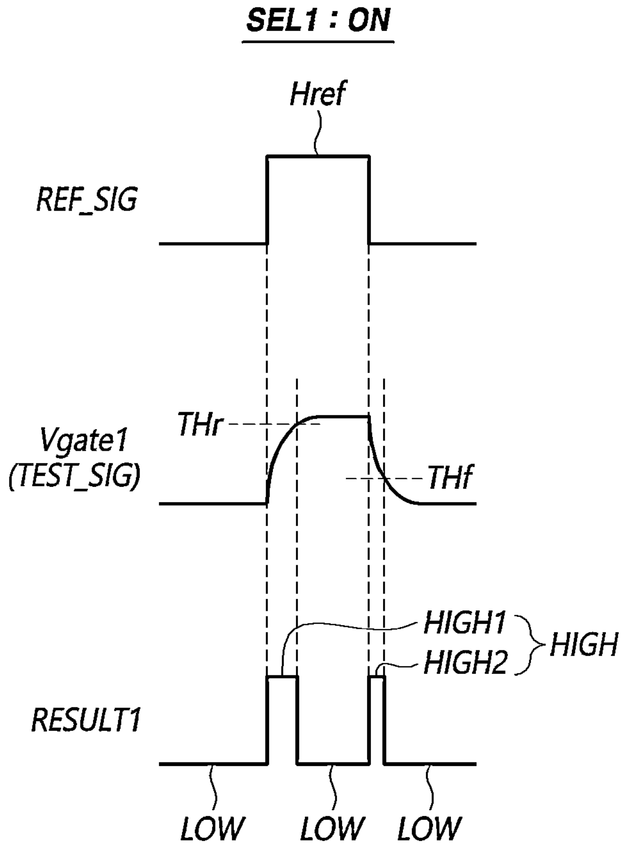
FIGS. 17 to 19 illustrate examples of signal waveforms for explaining the operation of the panel defect detection circuit according to embodiments of the present disclosure.
Figure 18:
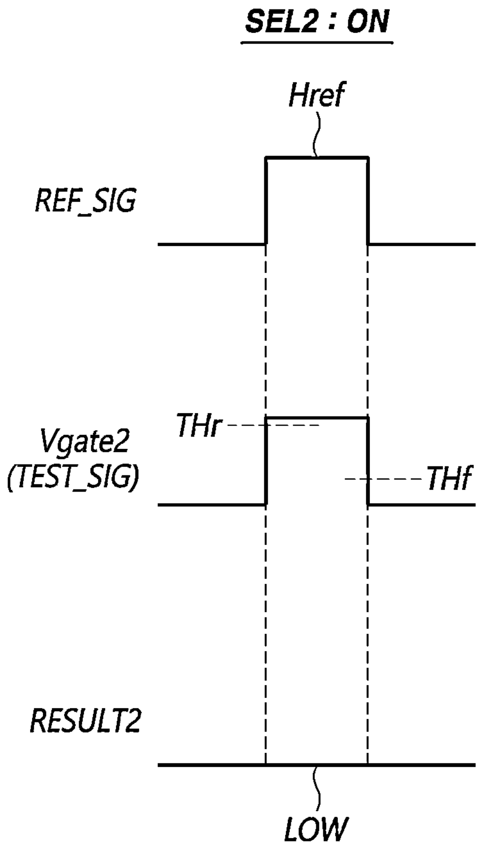
Figure 19:
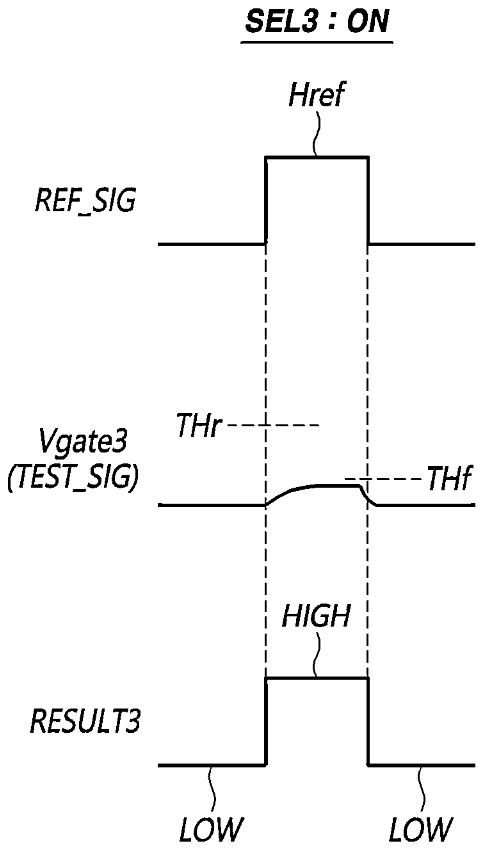

FIGS. 17 to 19 illustrate examples of signal waveforms for explaining the operation of the panel defect detection circuit 700 according to embodiments of the present disclosure.

However, as shown in FIG. 15, FIGS. 17 to 19 illustrate a case in which the panel defect PD occurs on or around the second and third gate lines GL2 and GL3 among the first to third gate lines GL1, GL2 and GL3 as an example.

FIG. 17 illustrates two input signals (REF_SIG and TEST_SIG) input to the logic circuit 921 and a first test result signal RESULT1 output from the level conversion circuit 922 in the case that the second and third selection switches SEL2 and SEL3 are in a turn-off state and the first selection switch SEL1 is in a turn-on state.

Referring to FIG. 17, the two input signals (REF_SIG and TEST_SIG) input to the logic circuit 921 may include a reference signal REF_SIG and a test signal TEST_SIG, and the test signal TEST_SIG may be a first gate signal Vgate1.

FIG. 18 illustrates two input signals (REF_SIG and TEST_SIG) input to the logic circuit 921 and a second test result signal RESULT2 output from the level conversion circuit 922 in the case that the first and third selection switches SEL1 and SEL3 are in a turn-off state and the second selection switch SEL2 is in a turn-on state.

Referring to FIG. 18, the two input signals (REF_SIG and TEST_SIG) input to the logic circuit 921 may include a reference signal REF_SIG and a test signal TEST_SIG, and the test signal TEST_SIG may be a second gate signal Vgate2.

FIG. 19 illustrates two input signals (REF_SIG and TEST_SIG) input to the logic circuit 921 and a third test result signal RESULT3 output from the level conversion circuit 922 in the case that the first and second selection switches SEL1 and SEL2 are in a turn-off state and the third selection switch SEL3 is in a turn-on state.

Referring to FIG. 19, the two input signals (REF_SIG and TEST_SIG) input to the logic circuit 921 may include a reference signal REF_SIG and a test signal TEST_SIG, and the test signal TEST_SIG may be a third gate signal Vgate3.

Referring to FIGS. 17 to 19, a signal waveform of the reference signal REF_SIG may be a perfect square wave. Therefore, the reference signal REF_SIG may be immediately changed from a low level voltage to a high level voltage without delay during rising, and may be immediately changed from a high level voltage to a low level voltage without delay during falling.

Referring to FIGS. 17 to 19, the first, second and third gate signals Vgate1, Vgate2 and Vgate3 are input to the panel defect detection circuit 700, and may be the test signals TEST_SIG for panel defect detection operations performed at different times.

Referring to FIGS. 17 to 19, since a panel defect PD occurs on or around the second and third gate lines GL2 and GL3 among the first to third gate lines GL1, GL2 and GL3, the first gate signal Vgate1 may have a normal signal waveform, and the second gate signal Vgate2 and the third gate signal Vgate3 may have abnormal signal waveforms.

Referring to FIGS. 17 to 19, the rising characteristics and falling characteristics of the first, second, and third gate signals Vgate1, Vgate2, and Vgate3 may be different from each other.

Referring to FIGS. 17 to 19, a rising start time of each of the first, second, and third gate signals Vgate1, Vgate2, and Vgate3 may be a rising start time of the reference signal REF_SIG. The falling start time of each of the first, second and third gate signals Vgate1, Vgate2 and Vgate3 may be a falling start time of the reference signal REF_SIG.

Referring to FIG. 17, the first gate signal Vgate1 is a signal applied to the first gate line GL1 disposed on the display panel 110, and a test signal TEST_SIG applied to the panel defect detection circuit 700. The first gate signal Vgate1 has a signal waveform having a rising delay time and a falling delay time due to a voltage drop.

Referring to FIG. 17, in the case of the first gate signal Vgate1, there may take some time (referred to as a rising delay time) to rise from a low level voltage to a high level voltage during rising.

Among the rising periods of the first gate signal Vgate1, a rising period having a voltage less than the first threshold voltage THr may be a period in which the voltage level of the first gate signal Vgate1 is determined as a low level voltage. Among the rising periods of the first gate signal Vgate1, a rising period having a voltage higher than the first threshold voltage THr may be a period in which the voltage level of the first gate signal Vgate1 is determined as a high level voltage.

Referring to FIG. 17, in the case of the first gate signal Vgate1, there may take some time (referred to as a falling delay time) to fall from a high level voltage to a low level voltage during falling.

Among the falling periods of the first gate signal Vgate1, a falling period having a voltage equal to or greater than the second threshold voltage THf may be a period in which the voltage level of the first gate signal Vgate1 is determined as a high level voltage. Among the falling periods of the first gate signal Vgate1, a falling period having a voltage less than the second threshold voltage THf may be a period in which the voltage level of the first gate signal Vgate1 is determined as a low level voltage.

In this case, the first threshold voltage THr and second threshold voltage THf may have the same voltage value. Alternatively, as shown in FIG. 17, the first threshold voltage THr and the second threshold voltage THf may have different voltage values.

Referring to FIG. 17, the first gate signal Vgate1 may have a signal waveform different from that of the reference signal REF_SIG due to the rising delay characteristics and falling delay characteristics of the first gate signal Vgate1.

Referring to FIG. 17, the first gate signal Vgate1 may rise to a high level voltage equal to or higher than the first threshold voltage THr while a certain amount of rising delay time exists during rising, and may be felled to a low level voltage less than the second threshold voltage THf while a certain amount of falling delay time exists during falling. The first test result signal RESULT1 generated according to the first gate signal Vgate1 and the reference signal REF_SIG may have two high level voltage periods HIGH separated by a low level voltage period LOW.

Referring to FIG. 17, a first high level voltage period HIGH1 of the first test result signal RESULT1 may correspond to a rising period with a voltage less than the first threshold voltage THr among rising periods of the first gate signal Vgate1 which is the test signal TEST_SIG.

Among the rising periods of the first gate signal Vgate1 as the test signal TEST_SIG, a rising period having a voltage less than the first threshold voltage THr may be a period determined with a low level voltage.

Among the rising periods of the first gate signal Vgate1 as the test signal TEST_SIG, a rising period having a voltage equal to or higher than the first threshold voltage THr may be a period determined with a high level voltage.

Referring to FIG. 17, a start time of a first high level voltage period HIGH1 in the first test result signal RESULT1 may correspond to a start time of a high level voltage period Href of the reference signal REF_SIG.

Referring to FIG. 17, a length of the first high level voltage period HIGH1 of the first test result signal RESULT1 may be shorter than a length of the high level voltage period Href of the reference signal REF_SIG.

Referring to FIG. 17, a second high level voltage period HIGH2 of the first test result signal RESULT1 may correspond to a falling period having a voltage equal to or higher than the second threshold voltage THf among the falling periods of the first gate signal Vgate1 as the test signal TEST_SIG.

Among the falling periods of the first gate signal Vgate1 which is the test signal TEST_SIG, a falling period having a voltage equal to or higher than the second threshold voltage THf may be a period considered with a high level voltage.

Among the falling periods of the first gate signal Vgate1 as the test signal TEST_SIG, a falling period less than the second threshold voltage THf may be a period considered with a low level voltage.

Referring to FIG. 17, a start time of a second high level voltage period HIGH2 of the first test result signal RESULT1 may correspond to an end time of the high level voltage period Href of the reference signal REF_SIG.

Referring to FIG. 17, a length of the second high level voltage period HIGH2 of the first test result signal RESULT1 may be shorter than a length of the high level voltage period Href of the reference signal REF_SIG.

Referring to FIG. 18, the second gate signal Vgate2 is a signal applied to the second gate line GL2 disposed on the display panel 110, and may be a test signal TEST_SIG applied to the panel defect detection circuit 700. The second gate signal Vgate2 may have a signal waveform in which almost no voltage drop occurs, so that a rising delay time and a falling delay time hardly exist.

Referring to FIG. 18, the second gate signal Vgate2 may immediately rise from a low level voltage to a high level voltage without delay during rising. In addition, the second gate signal Vgate2 may be immediately felled from a high level voltage to a low level voltage without delay during falling.

Referring to FIG. 18, the second gate signal Vgate2 may have the same or almost the same signal waveform as the reference signal REF_SIG due to the immediate rising characteristics and immediate falling characteristics of the second gate signal Vgate2.

Since the second gate signal Vgate2 has the same or almost the same signal waveform as the reference signal REF_SIG, the second gate signal Vgate2 may have the same voltage level as the reference signal REF_SIG at all times.

Accordingly, during a period in which the second gate signal Vgate2 is input to the panel defect detection circuit 700, a second test result signal RESULT2 generated according to the voltage level of the second gate signal Vgate2 and the voltage level of the reference signal REF_SIG may not have a high level voltage but only a low level voltage.

That is, while the second gate signal Vgate2 is input as the test signal TEST_SIG to the panel defect detection circuit 700, the second test result signal RESULT2 may have only a low level voltage period LOW without having a high level voltage period HIGH.

Referring to FIG. 19, a third gate signal Vgate3 is a signal applied to the third gate line GL3 disposed on the display panel 110, and may be a test signal TEST_SIG applied to the panel defect detection circuit 700. The third gate signal Vgate3 may have a signal waveform with a very large rising delay time due to a very large voltage drop.

Referring to FIG. 19, due to a very large rising delay time, the third gate signal Vgate3 does not rise to a high level voltage higher than the first threshold voltage THr during the rising period, and may have a voltage less than the first threshold voltage THr. In addition, the third gate signal Vgate3 may have a voltage lower than the second threshold voltage THf during the rising period. Accordingly, the third gate signal Vgate3 may be felled to a low level voltage from a voltage lower than the first threshold voltage THr and the second threshold voltage THf.

Referring to FIG. 19, due to the rising and falling characteristics of the third gate signal Vgate3, the third gate signal Vgate3 may be determined as having a low level voltage during a period in which the reference signal REF_SIG has a high level voltage.

Accordingly, while the third gate signal Vgate3 is input to the panel defect detection circuit 700, a third test result signal RESULT3 generated according to the voltage level of the third gate signal Vgate3 and the voltage level of the reference signal REF_SIG may have the same signal waveform as that of the reference signal REF_SIG. Accordingly, the third test result signal RESULT3 may have one high level voltage period HIGH.

Referring to FIG. 19, a start time of the high level voltage period HIGH of the third test result signal RESULT3 may correspond to a start time of the high level voltage period Href of the reference signal REF_SIG.

Referring to FIG. 19, an end time of the high level voltage period HIGH of the third test result signal RESULT3 may correspond to an end time of the high level voltage period Href of the reference signal REF_SIG.

Referring to FIG. 19, a length of the high level voltage period HIGH of the third test result signal RESULT3 may correspond to a length of the high level voltage period Href of the reference signal REF_SIG.

If the first to third test result signals RESULT1, RESULT2 and RESULT3 as shown in FIGS. 17 to 19 are transmitted to the controller 140, the controller 140 may determine whether the panel has a panel defect based on the first to third test result signals RESULT1, RESULT2 and RESULT3. Hereinafter, it will be described a panel defect determination process based on the test result signal RESULT in more detail.

The controller 140 may determine whether a panel defect PD exists based on the received test result signal RESULT. For example, the controller 140 determines whether or not there is a panel defect PD in the display panel 110 or a position of the panel defect PD based on at least one of the number and length of the high level voltage period included in the test result signals RESULT.

Referring to FIGS. 17 to 19, the test result signal RESULT may be one of a first type such as a first test result signal RESULT1, a second type such as a second test result signal RESULT2, and a third type such as a third test result signal RESULT3.

Referring to FIG. 17, if the test result signal RESULT has two high level voltage periods HIGH, the test result signal RESULT may be of the first type.

In the case that the test result signal RESULT is of the first type, the two high level voltage periods HIGH may include a first high level voltage period HIGH1 and a second high level voltage period HIGH2. The first high level voltage period HIGH1 and the second high level voltage period HIGH2 may be separated by the low level voltage period LOW. That is, the low level voltage period LOW may exist between the first high level voltage period HIGH1 and the second high level voltage period HIGH2.

Referring to FIG. 18, if a test result signal RESULT does not have a high level voltage period HIGH, the test result signal RESULT may be of the second type.

If the test result signal RESULT is of the second type, the test result signal RESULT may not have a high level voltage period HIGH but only a low level voltage period LOW.

Referring to FIG. 19, if a test result signal RESULT has one high level voltage period HIGH, the test result signal RESULT may be of a third type.

In the case that the test result signal RESULT is of the third type, the test result signal RESULT may have one high level voltage period HIGH, and may correspond to the reference signal REF_SIG.

If the test result signal RESULT does not include a high level voltage period HIGH (i.e., second type) or if the test result signal RESULT includes one high level voltage period HIGH (i.e., third type), the controller 140 may be configured to determine the abnormal test result signal RESULT and to determine that a panel defect PD has occurred in the display panel 110.

If the test result signal RESULT includes two high level voltage periods HIGH separated by a low level voltage period LOW, the controller 140 may not immediately determine whether a panel defect PD exists, and may determine whether the display panel 110 has a panel defect PD based on the respective lengths L1 and L2 of the first high level voltage period HIGH1 and the second high level voltage period HIGH2 included in the two high level voltage periods HIGH. Descriptions of FIGS. 14A and 14B may be similarly applicable to matters related to this.

If the test result signal RESULT includes two high level voltage periods HIGH, the controller 140 may detect lengths L1 and L2 of each of the first high level voltage period HIGH1 and the second high level voltage period HIGH2 included in the two high level voltage periods HIGH, and may determine whether the test result signal RESULT is normal and whether a panel defect PD has occurred based on this.

In the case that a test result signal RESULT has a first high level voltage period HIGH1 having a length L1 within the first threshold range TH_RNG1 and a second high level voltage period HIGH2 having a length L2 within the second threshold range TH_RNG2 (Case 1 and Case 4), the controller 140 may determine that no panel defect PD has occurred in the display panel 110.

That is, if the controller 140 determines that both the first condition (Case 1) in which the length L1 of the first high level voltage period HIGH1 falls within the first threshold range TH_RNG1 and a second condition (Case 4) in which the length L2 of the second high level voltage period HIGH2 falls within the second threshold range TH_RNG2 are satisfied, the controller 140 may determine that the test result signal RESULT is normal and that the panel defect PD does not occur in the display panel 110.

A panel defect detection circuit 700 and method for detecting a panel defect PD using a signal (e.g., a gate signal) output from the gate driving circuit 130 may be applied to the single gate driving structure (one side gate driving structure) of FIG. 5.

Hereinafter, it will be briefly described again the panel defect detection circuit 700 described above and the panel defect detection method executed by the panel defect detection circuit 700.

Figure 20:
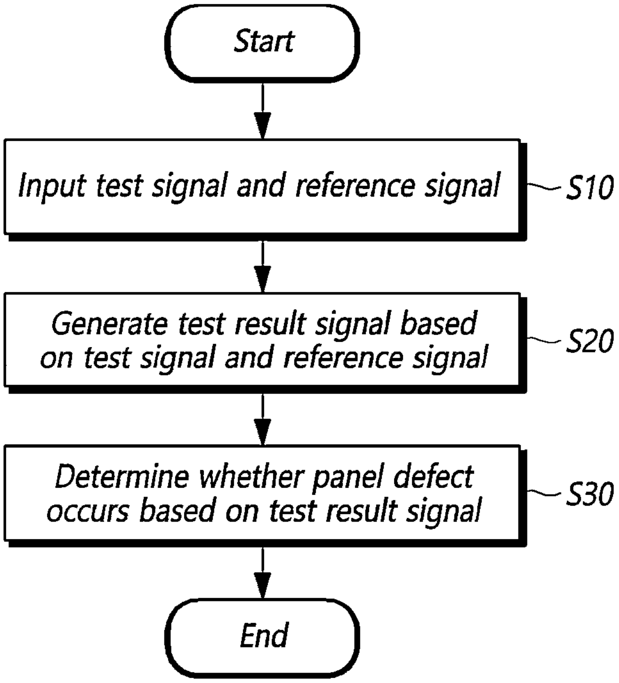
FIG. 20 is a flowchart of a panel defect detection method according to embodiments of the present disclosure.

FIG. 20 is a flowchart of a panel defect detection method according to embodiments of the present disclosure.

Referring to FIG. 20, a panel defect detection method according to embodiments of the present disclosure may include receiving a test signal TEST_SIG and a reference signal REF_SIG (S10), generating a test result signal RESULT based on the test signal TEST_SIG and the reference signal REF_SIG (S20), and determining whether a panel defect has occurred based on the test result signal RESULT (S30).

In the panel defect detection method according to embodiments of the present disclosure, the test signal TEST_SIG may correspond to one of a signal (e.g., a clock signal) input to the gate driving circuit 130 for driving the plurality of gate lines GL disposed on the display panel 110, and a signal (e.g., a gate signal) output from the gate driving circuit 130 to one of the plurality of gate lines GL.

The panel defect detection method according to embodiments of the present disclosure may be executed by the panel defect detection circuit 700 according to embodiments of the present disclosure.

In the panel defect detection method according to the above-described embodiments of the present disclosure, each of the plurality of sub-pixels SP disposed on the display panel 110 may or may not have a sub-pixel structure capable of sensing driving. As shown in FIG. 3, the sub-pixel structure capable of sensing driving may be a structure having a sensing transistor SENT connected to a second node N2 of the driving transistor DRT.

In the panel defect detection method according to the above-described embodiments of the present disclosure, each of the plurality of sub-pixels SP may have the simplest sub-pixel structure. Here, the simplest sub-pixel structure is a sub-pixel structure as shown in FIG. 2, and may include one light emitting device ED, two transistors DRT and SCT, and one capacitor Cst.

It will be briefly described the embodiments of the present disclosure described above as follows.

A display device according to embodiments of the present disclosure may include a display panel including a plurality of gate lines, a gate driving circuit configured to drive the plurality of gate lines, and a panel defect detection circuit configured to detect panel defects of a display panel by using a signal input to the gate driving circuit or a signal output from the gate driving circuit as a test signal, and a reference signal.

A display device according to embodiments of the present disclosure may include a controller configured to control the operation of the gate driving circuit and configured to determine whether or not the display panel has a panel defect based on a test result signal.

If a voltage level of a test signal and a voltage level of the reference signal are the same, the test result signal may have a low level voltage. If the voltage level of the test signal and the voltage level of the reference signal are different from each other, the test result signal may have a high level voltage.

The test result signal may be one of a first type having two high level voltage periods, a second type having no high level voltage period, and a third type having one high level voltage period.

The panel defect detection circuit may include an test circuit configured to receive the test signal and the reference signal and output the test result signal, and a signal supply circuit configured to supply the test signal and the reference signal to the test circuit.

The test circuit may include a logic circuit configured to output an output signal according to a voltage level of the test signal and a voltage level of the reference signal, and a level conversion circuit configured to convert a voltage level of the output signal to a selected value or less and output an output signal having the converted voltage level as the test result signal. In this case, the selected value corresponds to a maximum voltage level that the controller is able to handle.

The logic circuit may be configured to output the output signal having a low level voltage if the voltage level of the test signal and the voltage level of the reference signal are equal, and output the output signal having a high level voltage if the voltage level of the test signal and the voltage level of the reference signal are different from each other.

The controller may be configured to determine whether the panel defect exists in the display panel based on at least one of a number and a length of high level voltage periods included in the test result signal.

The controller may be configured to determine that a panel defect has occurred in the display panel in the case that the test result signal does not include a high level voltage period or the test result signal includes one high level voltage period.

If the test result signal includes two high level voltage period, the controller may be configured to determine whether the panel defect exists in the display panel based on a length of each of the two high level voltage periods.

The controller may be configured to determine that no panel defect has occurred in the display panel if the test result signal includes a first high level voltage period having a length within a first threshold range and a second high level voltage period having a length within a second threshold range.

The first high level voltage period may correspond to a rising period having a voltage less than a first threshold voltage among rising periods of the test signal, and the second high level voltage period may correspond to a falling period having a voltage more than a second threshold voltage among falling periods of the test signal.

The test signal may be a clock signal input to the gate driving circuit, or a gate signal generated by the gate driving circuit based on the clock signal and output to one of a plurality of gate lines.

The test signal may include a first clock signal, a second clock signal, and a third clock signal supplied to the gate driving circuit, The panel defect detection circuit may be connected to a first clock signal line, a second clock signal line and a third clock signal line for transmitting the first clock signal, the second clock signal and the third clock signal to the gate driving circuit The signal supply circuit may include a first port, a second port and a third port respectively connected to the first clock signal line, the second clock signal line and the third clock signal line.

The signal supply circuit may include a test port and a reference port connected to the test circuit.

The signal supply circuit may include a signal generation circuit configured to generate and output the reference signal, the first clock signal, the second clock signal, and the third clock signal, a test signal supply circuit configured to output the first clock signal, the second clock signal and the third clock signal to the first port, the second port and the third port, and configured to output one of the first clock signal, the second clock signal, and the third clock signal to the test port as the test signal, and a reference signal supply circuit configured to output the reference signal to the reference port.

The signal generation circuit may include a first level shifter for outputting the first clock signal by changing a voltage level of a first input signal, a second level shifter for outputting the second clock signal by changing a voltage level of a second input signal, and a third level shifter for outputting the third clock signal by changing a voltage level of a third input signal.

The first level shifter may include a first input node to which the first input signal is input, a first output node from which the first clock signal is output, and a first reference output node from which the reference signal is output, and the first output node may be electrically connected to the first port.

The second level shifter may include a second input node to which the second input signal is input, a second output node from which the second clock signal is output, and a second reference output node from which the reference signal is output, and the second output node may be electrically connected to the second port.

The third level shifter may include a third input node to which the third input signal is input, a third output node from which the third clock signal is output, and a third reference output node from which the reference signal is output, and the third output node may be electrically connected to the third port.

The test signal supply circuit may include a first selection switch configured to control a connection between the first output node and the test port, a second selection switch configured to control a connection between the second output node and the test port, and a third selection switch configured to control a connection between the third output node and the test port.

The reference signal supply circuit may include a first reference selection switch configured to control a connection between the first reference output node and the reference port, and a second reference selection switch configured to control a connection between the second reference output node and the reference port, and a third reference selection switch configured to control a connection between the third reference output node and the reference port.

The first selection switch and the first reference selection switch may be turned on or off at the same time, the second selection switch and the second reference selection switch may be turned on or off at the same time, and the third selection switch and the third reference selection switch may be turned on or turned off at the same time.

If the test signal is a gate signal output from the gate driving circuit to the gate line, the panel defect detection circuit may be connected to the gate line through which the gate signal is output from the gate driving circuit.

In this case, the signal supply circuit may include a first port, a second port, and a third port respectively connected to a first gate line, a second gate line, and a third gate line. The signal supply circuit may include a test port and a reference port connected to the test circuit. The signal supply circuit may include a test signal supply circuit configured to output a gate signal applied to one of the first port, the second port and the third port to the test port as the test signal, and a reference signal supply circuit configured to output the reference signal to the reference port.

The test signal supply circuit may include a first selection switch configured to control a connection between the first port and the test port, a second selection switch configured to control a connection between the second port and the test port, and a third selection switch configured to control a connection between the third port and the test port.

A panel defect detection circuit according to embodiments of the present disclosure may include a test circuit configured to output a test result signal using a test signal and a reference signal, and a signal supply circuit configured to supply the test signal and the reference signal to the test circuit.

The test signal may be a signal input to a gate driving circuit for driving a plurality of gate lines disposed on a display panel, or a signal output from the gate driving circuit to one of the plurality of gate lines.

The test signal may be a clock signal input to the gate driving circuit, or a gate signal generated by the gate driving circuit based on the clock signal and output to one gate line among a plurality of gate lines.

The test result signal may have a low level voltage if a voltage level of the test signal and a voltage level of the reference signal are equal. The test result signal may have a high level voltage if the voltage level of the test signal and the voltage level of the reference signal are different from each other.

The test result signal may be one of a first type having two high level voltage periods, a second type having no high level voltage period, and a third type having one high level voltage period.

The test circuit may include a logic circuit configured to output an output signal according to a voltage level of the test signal and a voltage level of the reference signal, and a level conversion circuit configured to convert a voltage level of the output signal to a selected value or less and output an output signal having the converted voltage level as the test result signal.

The test circuit may include an exclusive OR element outputting an output signal having a voltage level determined according to a voltage level of the test signal and a voltage level of the reference signal.

A panel defect detection method according to embodiments of the present disclosure may include receiving a test signal and a reference signal, generating a test result signal based on the test signal and the reference signal, and determining whether a panel defect occurs in a display panel based on the test result signal.

The test signal may correspond to one of a signal input to a gate driving circuit for driving a plurality of gate lines disposed on a display panel, and a signal output from the gate driving circuit to one of the plurality of gate lines.

If a voltage level of a test signal and a voltage level of a reference signal are the same, the test result signal may have a low level voltage. If the voltage level of the test signal and the voltage level of the reference signal are different from each other, the test result signal may have a high level voltage.

The test result signal may be one of a first type having two high level voltage periods, a second type having no high level voltage period, and a third type having one high level voltage period.

A display device according to embodiments of the present disclosure may comprise a display panel including a plurality of gate lines and a plurality of clock signal lines; a gate driving circuit electrically connected to the plurality of gate lines, the gate driving circuit configured to receive clock signals from the plurality of clock signal lines and output gate signals to the plurality of gate lines; and a panel defect detection circuit configured to detect a defect occurred within the display device based on at least one of either the clock signals input to the gate driving circuit or the gate signals output from the gate driving circuit.

The panel defect detection circuit may detect the defect based on using at least one of either the clock signals input to the gate driving circuit or the gate signals output from the gate driving circuit as a test signal.

The panel defect detection circuit may be electrically connected to the plurality of clock signal lines, and the panel defect detection circuit may include a logic circuit configured to receive the test signal and a reference signal and output an output signal based on the reference signal and the test signal.

The panel defect detection circuit may include a level conversion circuit electrically connected to the logic circuit, the level conversion circuit configured to convert a voltage level of the output signal to a selected value or less and output the converted voltage level of the output signal as a test result signal.

A display device according to embodiments of the present disclosure may comprise a controller electrically connected to the panel defect detection circuit, the controller configured to determine whether the display device includes the defect based on the test result signal. The selected value is indicative of a maximum voltage level that the controller can process for determining whether the display device includes the defect.

The controller may be configured to determine whether the defect is present based on at least one of either a number of consecutive high level values of high level voltage periods included in the test result signal or a length of high level voltage periods included in the test result signal.

The controller may be configured to determine whether the defect is present in the display device based on the test result signal not including a high level voltage period.

The controller may be configured to determine whether the defect is present in the display device based on the test result signal including only a high level voltage value.

If the test result signal includes two high level voltage periods, the controller may be configured to determine whether the defect is present in the display device based on a length of each of the two high level voltage periods.

The controller may be configured to determine that no defect is present in the display device if the test result signal includes a first high level voltage period having a length within a first threshold range and a second high level voltage period having a length within a second threshold range.

According to embodiments of the present disclosure, it is possible to provide a display device, a panel defect detection circuit and a panel defect detection method capable of accurately and simply detecting panel defects using signals related to gate driving without using a separate panel defect detection algorithm.

According to embodiments of the present disclosure, it is possible to provide a display device, a panel defect detection circuit and a panel defect detection method capable of accurately and simply detecting panel defects even with a simple sub-pixel structure without having a complex sub-pixel structure for detecting panel defects.

According to embodiments of the present disclosure, it is possible to simply detect the panel defects using a signal related to gate driving without using a separate complicated panel defect detection algorithm, thereby reducing power consumption required for panel defect detection (low power).

According to embodiments of the present disclosure, it is possible to detect panel defects in a method independent of sub-pixels without using a separate panel defect detection algorithm which requires changing the sub-pixel structure, so that the sub-pixel structure disposed in the display panel can be simplified, thereby simplifying the manufacturing process and reducing production energy (process optimization).

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a display panel including a plurality of gate lines;

a gate driving circuit configured to drive the plurality of gate lines; and a panel defect detection circuit configured to detect panel defects of the display panel by outputting a test result signal using at least one of either a signal input to the gate driving circuit or a signal output from the gate driving circuit as a test signal, and a reference signal, wherein the panel defect detection circuit is configured to detect the panel defects based on using at least one of either a clock signal input to the gate driving circuit or a gate signal output from the gate driving circuit as the test signal.

2. The display device of claim 1, wherein the test result signal has a low level voltage if a voltage level of the test signal and a voltage level of the reference signal are equal, and the test result signal has a high level voltage if the voltage level of the test signal and the voltage level of the reference signal are different from each other.

3. The display device of claim 1, wherein the test result signal includes a first type, a second type, and a third type, and wherein the first type of the test result signal has two high level voltage periods, the second type of the test result signal has no high level voltage period, and the third type of the test result signal has one high level voltage period.

4. The display device of claim 1, wherein the panel defect detection circuit includes a test circuit configured to receive the test signal and the reference signal and output the test result signal, and a signal supply circuit configured to supply the test signal and the reference signal to the test circuit, wherein the test circuit comprises:

a logic circuit configured to output an output signal according to a voltage level of the test signal and a voltage level of the reference signal; and a level conversion circuit configured to convert a voltage level of the output signal to a selected value or less and output an output signal having the converted voltage level as the test result signal.

5. The display device of claim 4, wherein the logic circuit is configured to:

output the output signal having a low level voltage if the voltage level of the test signal and the voltage level of the reference signal are equal, and output the output signal having a high level voltage if the voltage level of the test signal and the voltage level of the reference signal are different from each other.

6. The display device of claim 4, further comprising a controller coupled to the panel defect detection circuit, the controller configured to:

control an operation of the gate driving circuit;

determine whether a panel defect exists in the display panel based on the test result signal, wherein the selected value corresponds to a maximum voltage level that the controller is able to handle for determining whether the display panel includes a panel defect.

7. A display device, comprising:

a display panel including a plurality of gate lines;

a gate driving circuit configured to drive the plurality of gate lines; and a panel defect detection circuit configured to detect panel defects of the display panel by outputting a test result signal using at least one of either a signal input to the gate driving circuit or a signal output from the gate driving circuit as a test signal, and a reference signal, wherein the panel defect detection circuit is coupled to a controller configured to control an operation of the gate driving circuit and configured to determine whether a panel defect exists in the display panel, wherein the controller is configured to determine whether the panel defect exists in the display panel based on at least one of a number and a length of high level voltage periods included in the test result signal.

8. The display device of claim 7, wherein the controller is configured to determine that a panel defect has occurred in the display panel when the test result signal does not include a high level voltage period or the test result signal includes one high level voltage period.

9. The display device of claim 7, wherein, if the test result signal includes two high level voltage period, the controller is configured to determine whether the panel defect exists in the display panel based on a length of each of the two high level voltage periods.

10. The display device of claim 9, wherein, the controller is configured to determine that no panel defect has occurred in the display panel if the test result signal includes a first high level voltage period having a length within a first threshold range and a second high level voltage period having a length within a second threshold range.

11. The display device of claim 10, wherein the first high level voltage period corresponds to a rising period having a voltage less than a first threshold voltage among rising periods of the test signal, wherein the second high level voltage period corresponds to a falling period having a voltage more than a second threshold voltage among falling periods of the test signal.

12. The display device of claim 4, wherein the test signal includes a first clock signal, a second clock signal, and a third clock signal supplied to the gate driving circuit, wherein the panel defect detection circuit is electrically connected to a first clock signal line, a second clock signal line, and a third clock signal line for transmitting the first clock signal, the second clock signal, and the third clock signal to the gate driving circuit, respectively, wherein the signal supply circuit comprises:

a first port, a second port, and a third port respectively electrically connected to the first clock signal line, the second clock signal line, and the third clock signal line;

a test port and a reference port electrically connected to the test circuit;

a signal generation circuit configured to generate and output the reference signal, the first clock signal, the second clock signal, and the third clock signal;

a test signal supply circuit configured to output the first clock signal, the second clock signal, and the third clock signal to the first port, the second port, and the third port, respectively, and configured to output one of the first clock signal, the second clock signal, and the third clock signal to the test port as the test signal; and a reference signal supply circuit configured to output the reference signal to the reference port.

13. The display device of claim 4, wherein the test signal is a gate signal output from the gate driving circuit to the gate line, wherein the panel defect detection circuit is electrically connected to the gate line through which the gate signal is output from the gate driving circuit, wherein the signal supply circuit comprises:

a first port, a second port, and a third port respectively electrically connected to a first gate line, a second gate line, and a third gate line;

a test port and a reference port electrically connected to the test circuit;

a test signal supply circuit configured to output a gate signal applied to one of the first port, the second port and the third port to the test port as the test signal; and a reference signal supply circuit configured to output the reference signal to the reference port.

14. A panel defect detection circuit configured to detect a panel defect of a display panel, comprising:

a test circuit configured to output a test result signal using a test signal and a reference signal; and a signal supply circuit configured to supply the test signal and the reference signal to the test circuit, wherein the panel defect detection circuit is configured to detect the panel defect based on using at least one of either a clock signal input to a gate driving circuit for driving a plurality of gate lines disposed on the display panel, or a gate signal output from the gate driving circuit to one of the plurality of gate lines as the test signal.

15. A panel defect detection method, comprising:

receiving a test signal and a reference signal;

generating a test result signal based on the test signal and the reference signal; and determining whether a panel defect occurred in a display panel based on the test result signal, wherein the test signal corresponds to one of a signal input to a gate driving circuit for driving a plurality of gate lines disposed on the display panel, and a signal output from the gate driving circuit to one of the plurality of gate lines, and wherein the determining whether the panel defect occurred comprises determining whether the panel defect exists based on at least one of a number and a length of high level voltage periods included in the test result signal.

16. A display device, comprising:

a display panel including a plurality of gate lines and a plurality of clock signal lines;

a gate driving circuit electrically connected to the plurality of gate lines, the gate driving circuit configured to receive clock signals from the plurality of clock signal lines and output gate signals to the plurality of gate lines; and a panel defect detection circuit configured to detect a defect occurred within the display device based on at least one of either the clock signals input to the gate driving circuit or the gate signals output from the gate driving circuit, wherein the panel defect detection circuit is configured to detect the defect based on using at least one of either the clock signals input to the gate driving circuit or the gate signals output from the gate driving circuit as a test signal.

17. The display device of claim 16, wherein the panel defect detection circuit is electrically connected to the plurality of clock signal lines, wherein the panel defect detection circuit includes a logic circuit configured to receive the test signal and a reference signal and output an output signal based on the reference signal and the test signal.

18. The display device of claim 17, wherein the panel defect detection circuit includes a level conversion circuit electrically connected to the logic circuit, the level conversion circuit configured to convert a voltage level of the output signal to a selected value or less and output the converted voltage level of the output signal as a test result signal.

19. The display device of claim 18, comprising a controller electrically connected to the panel defect detection circuit, the controller configured to determine whether the display device includes the defect based on the test result signal, wherein the selected value is indicative of a maximum voltage level that the controller can process for determining whether the display device includes the defect.

* * * * *